(12) United States Patent
Gutman et al.

(10) Patent No.: US 10,469,109 B2
(45) Date of Patent: Nov. 5, 2019

(54) PREDISTORTION FOR TRANSMITTER WITH ARRAY

(71) Applicant: QUALCOMM Incorporated, San Diego, CA (US)

(72) Inventors: Igor Gutman, Ramat Gan (IL); Ariel Yaakov Sagi, Haifa (IL); Alecsander Petru Eitan, Haifa (IL)

(73) Assignee: QUALCOMM Incorporated, San Diego, CA (US)

( * ) Notice: Subject to any disclaimer, the term of this patent is extended or adjusted under 35 U.S.C. 154(b) by 52 days.

(21) Appl. No.: 15/709,208

(22) Filed: Sep. 19, 2017

(65) Prior Publication Data
US 2019/0089389 A1 Mar. 21, 2019

(51) Int. Cl.
*H04B 1/04* (2006.01)
*H04B 1/40* (2015.01)

(52) U.S. Cl.
CPC ............ *H04B 1/0475* (2013.01); *H04B 1/40* (2013.01); *H04B 2001/045* (2013.01); *H04B 2001/0425* (2013.01); *H04B 2001/0433* (2013.01)

(58) Field of Classification Search
CPC .................................................... H03F 1/3241
USPC ................................................. 375/295–297
See application file for complete search history.

(56) References Cited

U.S. PATENT DOCUMENTS

| | | | | |
|---|---|---|---|---|
| 5,740,520 A * | 4/1998 | Cyze | ...................... | H03F 1/3241 455/114.3 |
| 6,072,364 A * | 6/2000 | Jeckeln | .................. | H03F 1/3247 330/149 |
| 6,614,854 B1 * | 9/2003 | Chow | ................... | H04L 1/0016 330/302 |
| 6,677,870 B2 * | 1/2004 | Im | ......................... | H03F 1/3247 341/110 |
| 6,697,436 B1 * | 2/2004 | Wright | ............... | G01N 27/4163 330/106 |
| 6,751,447 B1 * | 6/2004 | Jin | ......................... | H03F 1/3252 330/136 |
| 6,798,843 B1 * | 9/2004 | Wright | .................. | H03F 1/3241 330/149 |
| 7,058,139 B2 * | 6/2006 | Duperray | ............... | H03C 3/403 375/297 |
| 7,058,369 B1 * | 6/2006 | Wright | .................. | H01Q 1/243 375/297 |
| 7,415,250 B2 * | 8/2008 | Sasaki | .................. | H03F 1/3247 375/296 |

(Continued)

FOREIGN PATENT DOCUMENTS

WO WO-2016167145 A1 10/2016

*Primary Examiner* — James M Perez
(74) *Attorney, Agent, or Firm* — Steven R. Thiel; Loza & Loza LLP

(57) ABSTRACT

In certain aspects of the present disclosure, a method for wireless communication comprises predistorting a first signal based on a set of coefficients to generate a first predistorted signal, outputting the first predistorted signal for a first transmission to a receiving device, and receiving a first feedback signal from the receiving device, wherein the first feedback signal provides feedback of a first receive signal at the receiving device corresponding to the first transmission. The method also comprises determining whether to store the set of coefficients in a memory based on the received first feedback signal, and storing the set of coefficients in the memory based on the determination.

13 Claims, 15 Drawing Sheets

(56) References Cited

U.S. PATENT DOCUMENTS

| | | | | |
|---|---|---|---|---|
| 7,627,293 B2* | 12/2009 | Bhandari | H03F 1/3247 | 330/149 |
| 7,746,955 B2* | 6/2010 | Rexberg | H03F 1/3258 | 375/254 |
| 7,894,508 B2* | 2/2011 | Hahm | H04B 1/70735 | 375/137 |
| 8,098,776 B2* | 1/2012 | Kent | H04B 7/0697 | 375/141 |
| 8,170,508 B2* | 5/2012 | Davies | H03F 1/3247 | 455/114.3 |
| 8,340,214 B2* | 12/2012 | Kang | H04L 25/03343 | 375/232 |
| 8,351,543 B2* | 1/2013 | Kenington | H03F 1/3247 | 375/259 |
| 8,385,391 B2* | 2/2013 | Balasubramanian | H03F 1/3247 | 375/219 |
| 8,542,768 B2* | 9/2013 | Kim | H03F 1/3247 | 375/297 |
| 8,693,525 B2* | 4/2014 | Rick | H04B 1/707 | 375/146 |
| 8,755,454 B2* | 6/2014 | Sorrells | H04B 1/04 | 375/295 |
| 8,824,975 B2* | 9/2014 | Sato | H03F 1/3247 | 455/78 |
| 8,831,136 B2* | 9/2014 | Ishikawa | H04B 15/00 | 375/295 |
| 8,903,018 B2* | 12/2014 | Wang | H04B 17/102 | 375/297 |
| 9,041,464 B2* | 5/2015 | Komninakis | H03F 1/0244 | 330/149 |
| 9,490,881 B2* | 11/2016 | Wimpenny | H03F 1/0222 | |
| 9,647,717 B2* | 5/2017 | Xiong | H03F 3/24 | |
| 9,749,161 B1* | 8/2017 | Gal | H04L 25/03885 | |
| 9,762,266 B2* | 9/2017 | Weissman | H04B 1/0475 | |
| 9,813,085 B1* | 11/2017 | Butler | H04B 1/0458 | |
| 9,948,490 B2* | 4/2018 | Eitan | H04L 27/367 | |
| 9,960,794 B2* | 5/2018 | Weissman | H04B 17/23 | |
| 9,998,077 B2* | 6/2018 | Mehrabi | H03F 1/34 | |
| 10,056,941 B2* | 8/2018 | Weissman | H04B 3/487 | |
| 10,116,370 B2* | 10/2018 | Obara | H04B 7/04 | |
| 2008/0013639 A1* | 1/2008 | Rick | H04B 1/707 | 375/260 |
| 2010/0323641 A1* | 12/2010 | Aparin | H03F 1/3258 | 455/114.3 |
| 2011/0270590 A1* | 11/2011 | Aparin | G06K 9/00496 | 703/2 |
| 2013/0077708 A1* | 3/2013 | Sorrells | H04B 1/04 | 375/295 |
| 2013/0094550 A1* | 4/2013 | Coan | H03F 1/3247 | 375/222 |
| 2016/0285484 A1* | 9/2016 | Weissman | H04B 1/0475 | |
| 2016/0344434 A1* | 11/2016 | Zhang | H04B 7/0617 | |
| 2017/0134210 A1* | 5/2017 | Eitan | H04L 27/367 | |
| 2017/0244582 A1* | 8/2017 | Gal | H04L 25/03885 | |
| 2017/0366209 A1* | 12/2017 | Weissman | H04B 17/23 | |
| 2017/0366226 A1* | 12/2017 | Weissman | H04B 3/487 | |
| 2018/0053997 A1* | 2/2018 | Noto | H03F 1/32 | |
| 2018/0198584 A1* | 7/2018 | Sanderovich | H04L 27/2613 | |
| 2018/0219566 A1* | 8/2018 | Weissman | H04B 17/23 | |
| 2018/0269839 A1* | 9/2018 | Mehrabi | H03F 1/34 | |
| 2019/0068133 A1* | 2/2019 | Gutman | H03F 1/3247 | |
| 2019/0068429 A1* | 2/2019 | Sagi | H04L 27/367 | |
| 2019/0089389 A1* | 3/2019 | Gutman | H04B 1/0475 | |
| 2019/0190552 A1* | 6/2019 | Sagi | H04B 1/0475 | |

* cited by examiner

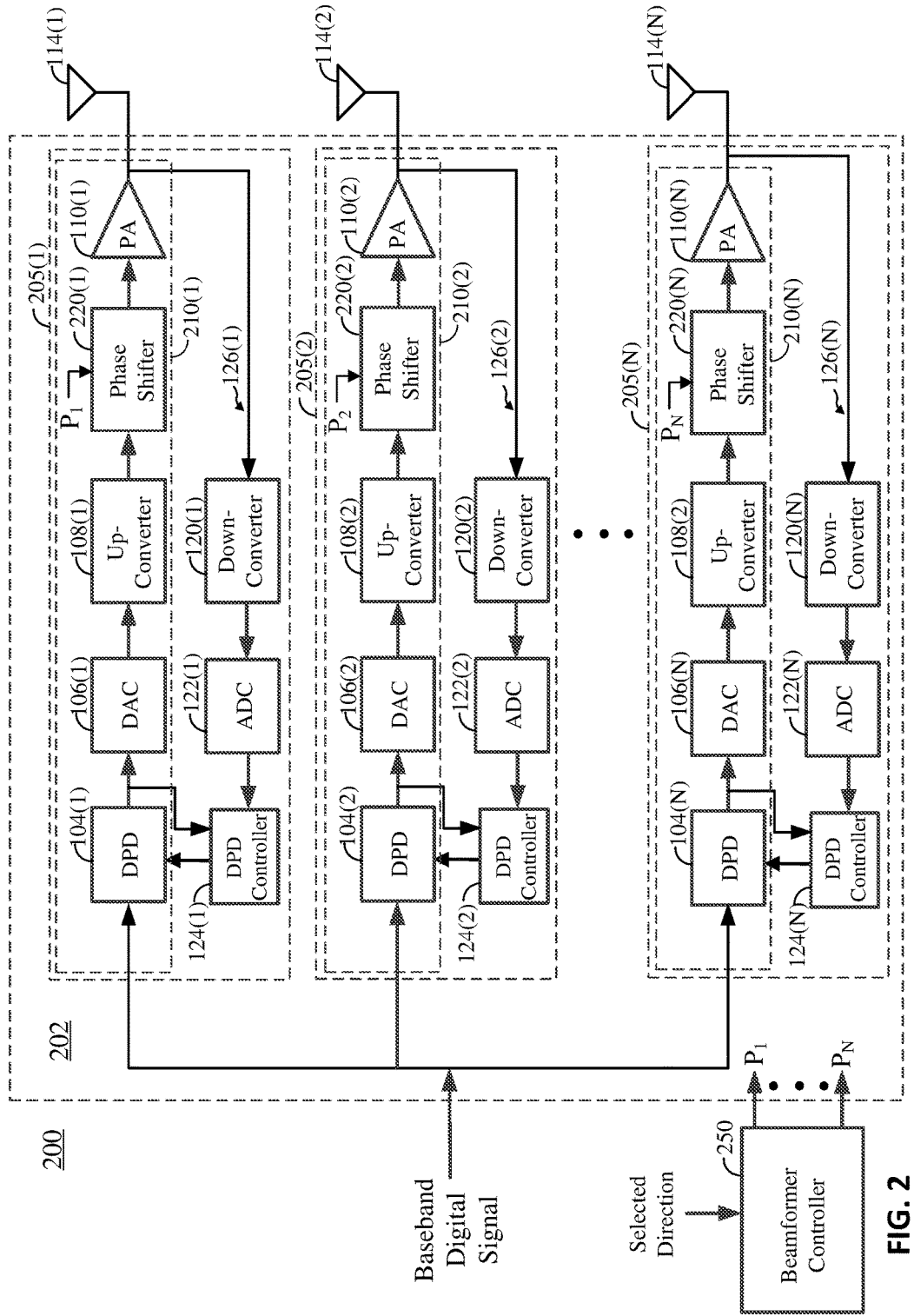

1010

| Backoff Value$_1$ | Direction$_1$ | Set of Predistortion Coefficients$_{1,1}$ |
| | Direction$_2$ | Set of Predistortion Coefficients$_{1,2}$ |
| | ⋮ | ⋮ |
| | Direction$_L$ | Set of Predistortion Coefficients$_{1,L}$ |
| Backoff Value$_2$ | Direction$_1$ | Set of Predistortion Coefficients$_{2,1}$ |
| | Direction$_2$ | Set of Predistortion Coefficients$_{2,2}$ |
| | ⋮ | ⋮ |
| | Direction$_L$ | Set of Predistortion Coefficients$_{2,L}$ |
| ⋮ | ⋮ | ⋮ |
| Backoff Value$_K$ | Direction$_1$ | Set of Predistortion Coefficients$_{K,1}$ |
| | Direction$_2$ | Set of Predistortion Coefficients$_{K,2}$ |
| | ⋮ | ⋮ |
| | Direction$_L$ | Set of Predistortion Coefficients$_{K,L}$ |

FIG. 10

PREDISTORTION FOR TRANSMITTER WITH ARRAY

FIELD

The present disclosure generally relates to wireless communications and, more particularly, to methods and apparatuses for predistortion (PD).

BACKGROUND

A transmitting device may transmit a signal using an array of antennas. In this regard, the transmitting device may include a separate power amplifier (PA) for each antenna in the array, in which each PA amplifies the signal with sufficient power for wireless transmission to a remote device via the respective antenna. Each PA is typically a non-linear device with a limited linear dynamic range (DR). For power efficiency, it is desirable to drive each PA as close as possible to saturation. However, driving each PA close to saturation causes each PA to operate outside its linear range, which can lead to significant non-linear distortion if not corrected.

SUMMARY

A first aspect relates to an apparatus. The apparatus comprises a processing system configured to configure a predistorter to predistort a first signal based on a set of coefficients to generate a first predistorted signal, and an interface configured to output the first predistorted signal for a first transmission to a receiving device, and to receive a first feedback signal from the receiving device, wherein the first feedback signal provides feedback of a first receive signal at the receiving device corresponding to the first transmission. The processing system is further configured to determine whether to store the set of coefficients in a memory based on the received first feedback signal, and store the set of coefficients in the memory based on the determination.

A second aspect relates to an apparatus. The apparatus comprises a processing system configured to configure a predistorter to predistort each one of a plurality of signals based on a respective one of a plurality of sets of coefficients to generate a respective one of a plurality of predistorted signals, and an interface configured to output each one of the plurality of predistorted signals for transmission to a receiving device, and to receive a plurality of feedback signals from the receiving device, wherein each one of the plurality of feedback signals provides feedback of a respective one of a plurality of receive signals at the receiving device corresponding to the transmission of a respective one of the plurality of predistorted signals. The processing system is further configured to select one of the plurality of sets of coefficients based on the plurality of feedback signals, and store the selected one of the plurality of sets of coefficients in a memory.

A third aspect relates to a method for wireless communications. The method comprises predistorting a first signal based on a set of coefficients to generate a first predistorted signal, outputting the first predistorted signal for a first transmission to a receiving device, and receiving a first feedback signal from the receiving device, wherein the first feedback signal provides feedback of a first receive signal at the receiving device corresponding to the first transmission. The method also comprises determining whether to store the set of coefficients in a memory based on the received first feedback signal, and storing the set of coefficients in the memory based on the determination.

A fourth aspect relates to a method for wireless communications. The method comprises predistorting each one of a plurality of signals based on a respective one of a plurality of sets of coefficients to generate a respective one of a plurality of predistorted signals, outputting each one of the plurality of predistorted signals for transmission to a receiving device, and receiving a plurality of feedback signals from the receiving device, wherein each one of the plurality of feedback signals provides feedback of a respective one of a plurality of receive signals at the receiving device corresponding to the transmission of a respective one of the plurality of predistorted signals. The method also comprises selecting one of the plurality of sets of coefficients based on the plurality of feedback signals, and storing the selected one of the plurality of sets of coefficients in a memory.

A fifth aspect relates to an apparatus for wireless communications. The apparatus comprises means for predistorting a first signal based on a set of coefficients to generate a first predistorted signal, means for outputting the first predistorted signal for a first transmission to a receiving device, and means for receiving a first feedback signal from the receiving device, wherein the first feedback signal provides feedback of a first receive signal at the receiving device corresponding to the first transmission. The apparatus also comprises means for determining whether to store the set of coefficients in a memory based on the received first feedback signal, and means for storing the set of coefficients in the memory based on the determination.

A sixth aspect relates to an apparatus for wireless communications. The apparatus comprises means for predistorting each one of a plurality of signals based on a respective one of a plurality of sets of coefficients to generate a respective one of a plurality of predistorted signals, means for outputting each one of the plurality of predistorted signals for transmission to a receiving device, and means for receiving a plurality of feedback signals from the receiving device, wherein each one of the plurality of feedback signals provides feedback of a respective one of a plurality of receive signals at the receiving device corresponding to the transmission of a respective one of the plurality of predistorted signals. The apparatus also comprises means for selecting one of the plurality of sets of coefficients based on the plurality of feedback signals, and means for storing the selected one of the plurality of sets of coefficients in a memory.

A seventh aspect relates to a computer readable medium comprising instructions for predistorting a first signal based on a set of coefficients to generate a first predistorted signal, outputting the first predistorted signal for a first transmission to a receiving device, and receiving a first feedback signal from the receiving device, wherein the first feedback signal provides feedback of a first receive signal at the receiving device corresponding to the first transmission. The computer readable medium also comprises instructions for determining whether to store the set of coefficients in a memory based on the received first feedback signal, and storing the set of coefficients in the memory based on the determination.

An eighth aspect relates to a computer readable medium comprising instructions for predistorting each one of a plurality of signals based on a respective one of a plurality of sets of coefficients to generate a respective one of a plurality of predistorted signals, outputting each one of the plurality of predistorted signals for transmission to a receiving device, and receiving a plurality of feedback signals from the receiving device, wherein each one of the plurality of feedback signals provides feedback of a respective one of a plurality of receive signals at the receiving device corresponding to the transmission of a respective one of the plurality of predistorted signals. The computer readable medium also comprises instructions for selecting one of the plurality of sets of coefficients based on the plurality of feedback signals, and storing the selected one of the plurality of sets of coefficients in a memory.

A ninth aspect relates to a wireless node. The wireless node comprises a transceiver, a processing system configured to configure a predistorter to predistort a first signal based on a set of coefficients to generate a first predistorted signal, and an interface configured to output the first predistorted signal for transmission to a receiving device via the transceiver, and to receive a first feedback signal from the receiving device, wherein the first feedback signal provides feedback of a first receive signal at the receiving device corresponding to the first transmission. The processing system is further configured to determine whether to store the set of coefficients in a memory based on the received first feedback signal, and store the set of coefficients in the memory based on the determination.

A tenth aspect relates to a wireless node. The wireless node comprises a transceiver, a processing system configured to configure a predistorter to predistort each one of a plurality of signals based on a respective one of a plurality of sets of coefficients to generate a respective one of a plurality of predistorted signals, and an interface configured to output each one of the plurality of predistorted signals for transmission to a receiving device via the transceiver, and to receive a plurality of feedback signals from the receiving device, wherein each one of the plurality of feedback signals provides feedback of a respective one of a plurality of receive signals at the receiving device corresponding to the transmission of a respective one of the plurality of predistorted signals. The processing system is further configured to select one of the plurality of sets of coefficients based on the plurality of feedback signals, and store the selected one of the plurality of sets of coefficients in a memory.

BRIEF DESCRIPTION OF THE DRAWINGS

FIG. 2 illustrates an example of a transmitter including multiple transmit chains and a separate digital predistorter for each transmit chain according to certain aspects of the present disclosure.

FIG. 10 illustrates an example of a lookup table for storing predistortion coefficients for different transmit beam directions and backoff values according to certain aspects of the present discourse.

DETAILED DESCRIPTION

Figure 1A:
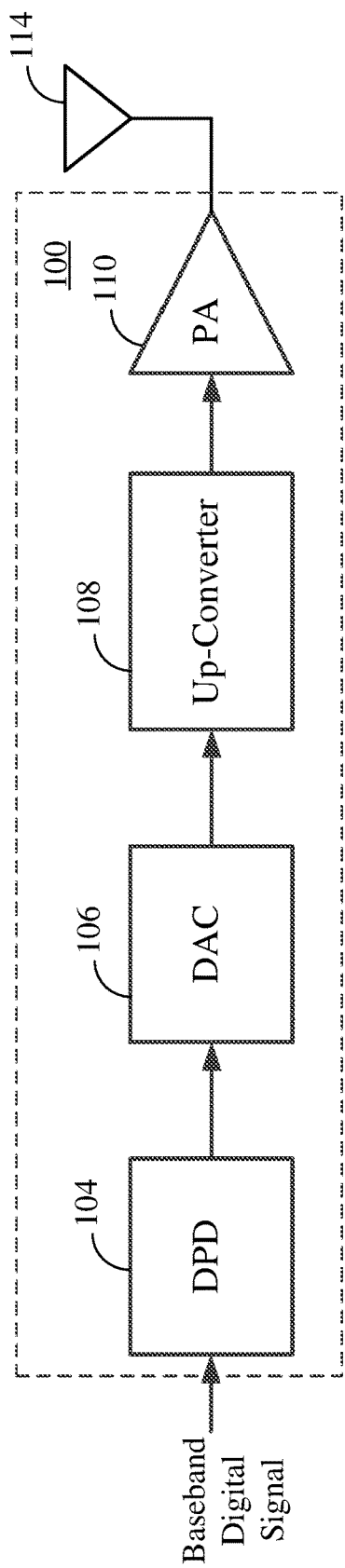
FIG. 1A illustrates an example of a transmitter employing digital predistortion in an open-loop configuration according to certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

As discussed above, power amplifiers (PAs) can become significantly non-linear close to saturation. For applications where power efficiency is not crucial, non-linearity can be avoided by backing off a PA from saturation into the linear region of the PA. However, for wireless communications, power efficiency is often quite important. To improve power efficiency, the input signal applied to a PA is set to a power level to drive the PA as close to saturation as possible.

Although driving the PA close to saturation improves power efficiency, it can also significantly distort the output signal from the PA due to the non-linearity of the PA, particularly when the input signal has a high peak-to-average-power ratio (PAPR) as is common in wireless communication. The resulting signal distortion has two main components: an in-band component and an out-of-band component. The in-band distortion can result in an increase in the error vector magnitude (EVM) of the in-band signal component. The out-of-band distortion can result in pollution or interference to adjacent channel transmission, i.e., adjacent channel interference (ACI).

To drive the PA as close as possible to saturation for power efficiency purposes, while also reducing distortion of the output signal of the PA, a wireless transmitter may employ a digital predistorter (DPD). A DPD reduces non-linear distortion at the output of a PA by applying an inverse of the non-linear distortion of the PA to the input signal to substantially cancel out the non-linear distortion. In this manner, the amount of back off from saturation can be significantly reduced compared to a transmitter that does not employ a DPD, thus improving power efficiency without introducing significant signal distortion.

FIG. 1A shows an example of a transmitter 100 employing predistortion according to certain aspects of the present disclosure. The transmitter 100 includes a digital predistorter (DPD) 104, a digital-to-analog converter (DAC) 106, a frequency up-converter 108, and a power amplifier (PA) 110.

In operation, the DPD 104 receives a baseband digital signal (generated by a baseband processor or modem of the wireless device in which the transmitter 100 is incorporated). The DPD 104 predistorts the baseband digital signal to reduce non-linear distortion at the output of the PA 110, as discussed further below. The DAC 106 converts the predistorted signal into an analog signal. The frequency up-converter 108 frequency up-converts the analog signal into a radio frequency (RF) signal (e.g., by mixing the analog signal with a high-frequency signal from a local oscillator (LO)). The PA 110 amplifies the RF signal to generate a transmit output signal, which is output to an antenna 114 for wireless transmission to a receiving device (not shown). For power efficiency purposes, the RF signal at the input of the PA 110 may be set to drive the PA 110 close to saturation. If not for the DPD 104, this would result in significant non-linear distortion in the output signal of the transmitter 100.

As discussed above, the DPD 104 is used to reduce non-linear distortion at the output of the PA 110. The DPD 104 is a non-linear device that is placed in the transmit path before the PA 110. The non-linear response (transfer function) of the DPD 104 is configured according to a set of predistortion coefficients such that the non-linear response of the DPD 104 substantially cancels out the non-linear response of the PA 110, resulting in reduced non-linear distortion at the output of the PA 110.

In one example, the DPD 104 may comprise one or more non-linear filters, in which the predistortion coefficients of the DPD 104 correspond to filter coefficients of the one or more non-linear filters. In another example, the non-linear response of the DPD 104 may be specified by a polynomial function, in which the predistortion coefficients DPD 104 correspond to polynomial coefficients of the polynomial function.

In the example shown in FIG. 1A, the transmitter 100 employs digital predistortion in an open-loop configuration. That is, the predistortion coefficients are static or predetermined and may be set in advance (e.g., at a factory location).

Figure 1B:
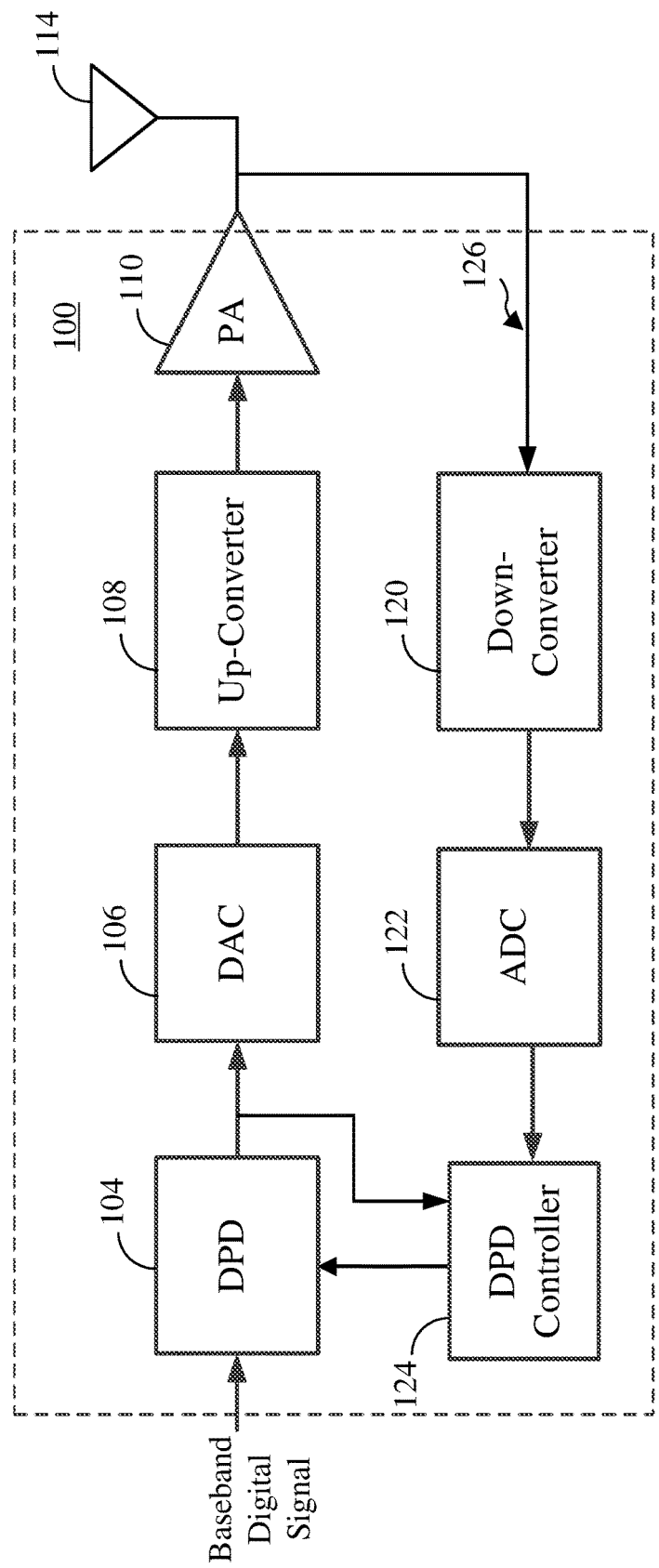
FIG. 1B illustrates an example of a transmitter employing digital predistortion in a closed-loop configuration according to certain aspects of the present disclosure.

FIG. 1B shows an example in which the transmitter 100 employs digital predistortion in a closed-loop configuration. In this example, the transmitter 100 further includes a frequency down-converter 120, an analog-to-digital converter (ADC) 122, and a DPD controller 124. The frequency down-converter 120 and ADC 122 are in a feedback path 126 that runs from the output of the PA 110 to the DPD controller 124, as shown in FIG. 1B.

In operation, the frequency down-converter 120 frequency down-converts the output signal of the PA 110 into a baseband feedback signal. The ADC 122 converts the baseband feedback signal into a digital feedback signal, which is input to the DPD controller 124. The digital feedback signal provides the DPD controller 124 with feedback of the PA output signal. This allows the DPD controller 124 to determine the non-linear characteristics of the PA output signal, and to dynamically or adaptively adjust the predistortion coefficients of the DPD 104 based on the current and/or historical non-linear characteristics of the PA output signal to reduce non-linearity at the output of the PA 110. In some aspects, the DPD controller 124 may determine the non-linear characteristics of the PA output signal by comparing the digital feedback signal of the PA output with the digital signal at the output of the DPD 104.

FIG. 2 shows an example of a transmitting device 200 that includes a transmitter 202 and an antenna array including N antennas 114(1)-114(N). The transmitter includes N transmit circuits 205(1)-205(N) (one transmit circuit for each of the N antennas 114(1)-114(N) of the antenna array). Each transmit circuit 205(1)-205(N) includes a respective transmit chain 210(1)-210(N) coupled to the respective one of the antennas 114(1)-114(N) of the array. Each transmit chain 210(1) to 210(N) includes a respective DPD 104(1)-104(N), a respective DAC 106(1)-106(N), a respective frequency up-converter 108(1)-108(N), a respective phase shifter 220(1)-220(N), and a respective PA 110(1)-110(N). As discussed further below, the phase shifters 220(1)-220(N) are used to electronically steer the transmit beam of the antenna array by applying a different phase shift to the signal for each antenna 114(1)-114(N) of the array.

In operation, the transmitter 202 receives a baseband digital signal (generated by a baseband processor or modem of the wireless device in which the transmitter is incorporated). The baseband digital signal is input to each of the transmit chains 210(1)-210(N), as shown in FIG. 2. In each transmit chain 210(1)-210(N), the respective DPD 104(1)-104(N) predistorts the baseband digital signal to reduce non-linear distortion at the output of the respective PA 110(1)-110(N), and the respective DAC 106(1)-106(N) converts the respective predistorted signal into a respective analog signal. In each transmit chain 210(1)-210(N), the respective frequency up-converter 108(1)-108(N) then frequency up-converts the respective analog signal into a respective radio frequency (RF) signal, the respective phase shifter 220(1)-220(N) shifts the phase of the respective RF signal by a respective phase shift, and the respective PA 110(1)-110(N) amplifies the respective phase-shifted signal for transmission. Each transmit chain 210(1)-210(N) outputs the respective output signal to the respective antenna 114(1)-114(N) of the antenna array for wireless transmission.

A beamformer controller 250 controls the phase shifts (labeled $P_1$ to $P_N$) of the phase shifters 220(1)-220(N) in the transmit chains 210(1)-210(N) according to a selected transmit beam direction for the antenna array. More particularly, the beamformer controller 250 sets the phase shifts $P_1$ to $P_N$ of the phase shifters 220(1)-220(N) such that the output signals of the transmit chains 210(1)-210(N) are phase shifted relative to one another according to the selected transmit beam direction. The selected transmit beam direction may be directed towards a target receiving device to increase transmission power in the direction of the receiving device. For ease of illustration, the individual connections between the beamformer controller 250 and the phase shifters 220(1)-220(N) are not shown in FIG. 2.

Each transmit circuit 205(1)-205(N) also includes a respective frequency down-converter 120(1)-120(N), a respective ADC 122(1)-1(N), and a respective DPD controller 124(1)-124(N). In each transmit circuit 205(1)-205(N), the respective frequency down-converter 120(1)-120(N) and the respective ADC 122(1)-122(N) are in a respective feedback path 126(1)-126(N) that runs from the output of the respective PA 110(1)-110(N) to the respective DPD controller 124(1)-124(N). In each transmit circuit 205(1)-205(N), the respective frequency down-converter 120(1)-120(N) frequency down-converts the output signal of the respective PA 110(1)-110(N) into a respective baseband feedback signal, and the respective ADC 122(1)-122(N) converts the respective baseband feedback signal into a respective digital feedback signal, which is input to the respective DPD controller 124(1)-124(N).

Thus, the DPD controller 124(1)-124(N) in each transmit circuit 205(1)-205(N) receives a respective digital feedback signal that provides feedback of the output signal of the respective PA 110(1)-110(N). This allows the DPD controller 124(1)-124(N) in each transmit circuit 205(1)-205(N) to determine the non-linear characteristics of the respective PA output signal, and to adjust the predistortion coefficients of the respective DPD 104(1)-104(N) based on the current and/or historical non-linear characteristics of the respective PA output signal to reduce non-linearity at the output of the respective PA 110(1)-110(N).

The predistortion approach illustrated in FIG. 2 employs a separate DPD 104(1)-104(N) and feedback path 126(1)-126(N) for each PA 110(1)-110(N) in the transmitter 202, in which the set of predistortion coefficients for each DPD 104(1)-104(N) is adjusted according to the non-linear characteristics of the respective PA 110(1)-110(N). Thus, this approach optimizes predistortion for each PA 110(1)-110(N) in the transmitter 202, and hence each antenna 114(1)-114(N) in the antenna array. However, this approach is expensive in terms of chip area and power consumption since it requires a separate DPD and feedback path for each antenna 114(1)-114(N) in the array. For a large antenna array (e.g., an array with thirty-two or sixty-four antennas), the cost of this approach can be prohibitive, making this approach impractical for many applications.

Embodiments of the present disclosure provide a much more cost-effective solution to non-linear distortion for large antenna arrays. Instead of using a separate DPD and feedback path for each antenna of an antenna array, embodiments of the present disclosure employ a single DPD for the antenna array, in which the predistortion coefficients of the DPD may be optimized for the array instead of per antenna (as in the approach illustrated in FIG. 2).

Figure 3:
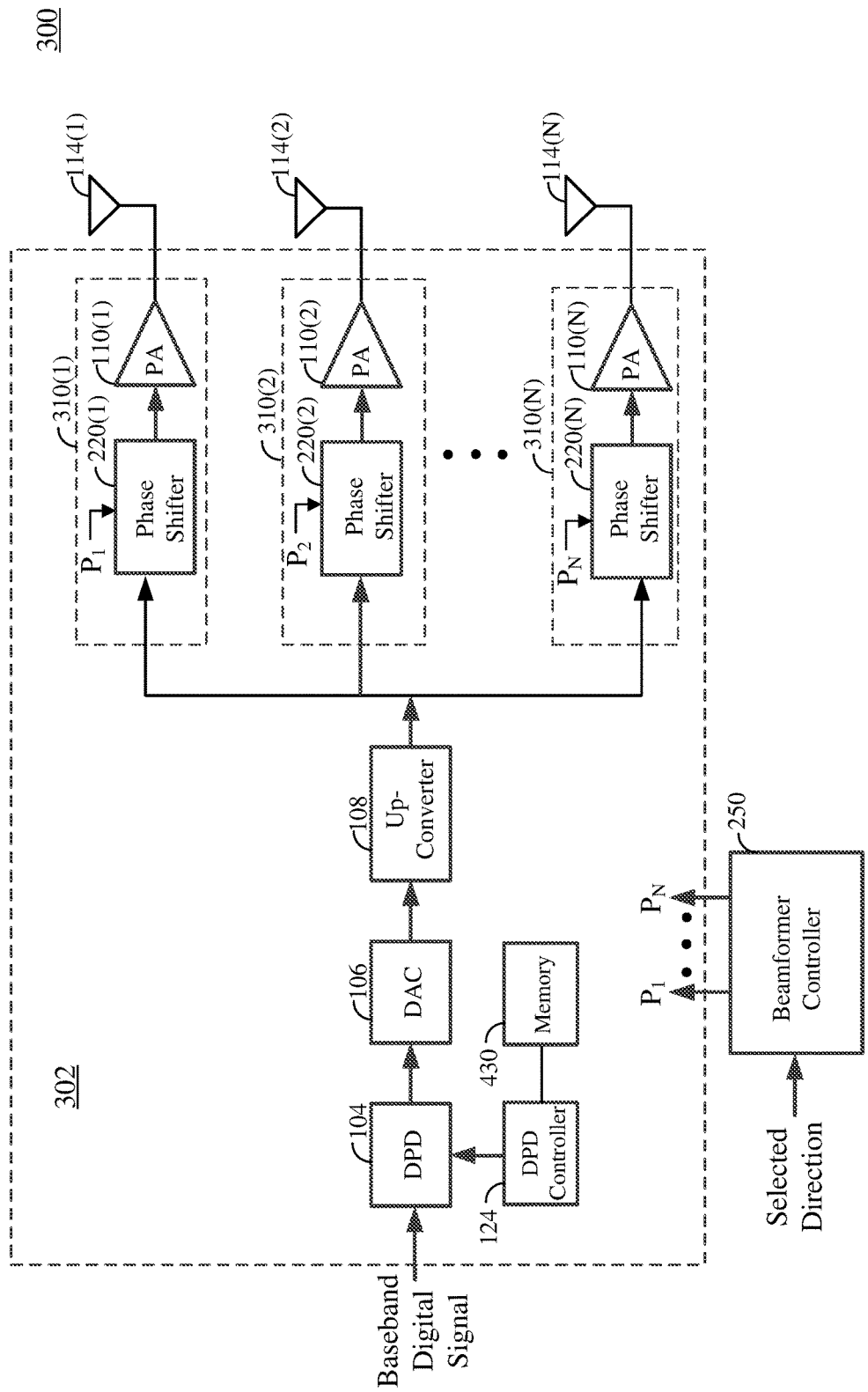
FIG. 3 illustrates an example of a transmitter including a digital predistorter that is shared by multiple transmit chains according to certain aspects of the present disclosure.

FIG. 3 shows an example of a transmitting device 300 according to aspects of the present disclosure. The transmitting device 300 includes a transmitter 302 and an antenna array including N antennas 114(1)-114(N). As shown in FIG. 3, the transmitter 302 includes multiple transmit chains 310(1)-310(N) (one transmit chain for each of the N antennas 114(1)-114(N) of the antenna array). The output of each transmit chain 310(1)-310(N) is coupled to the respective antenna 114(1)-114(N) of the array, and includes a respective phase shifter 220(1)-220(N) and respective PA 110(1)-110(N).

The transmitter 302 also includes a DPD 104, a DAC 106 and an up-converter 108 that are shared by the transmit chains 310(1)-310(N) of the transmitter 302. Thus, in this example, the transmitter 302 uses a single DPD 104 for the PAs 110(1)-110(N) of the transmit chains 310(1)-310(N) instead of a separate DPD for each PA. This significantly reduces the cost of the transmitter 302 compared with the transmitter 202 illustrated in FIG. 2.

In operation, the transmitter 302 receives a baseband digital signal (generated by a baseband processor or modem of the wireless device in which the transmitter is incorporated). The DPD 104 predistorts the baseband digital signal, the DAC 106 converts the predistorted digital signal into an analog predistorted signal, and the up-converter 108 frequency up-converts the analog predistorted signal into an RF predistorted signal. The RF predistorted signal is then input to each of the transmit chains 310(1)-310(N). This may be accomplished, for example, by splitting the RF signal into N signals using a power divider (not shown), and inputting each of the N signals to a respective one of the transmit chains 310(1)-310(N).

In each transmit chain 310(1)-310(N), the respective phase shifter 220(1)-220(N) shifts the phase of the respective RF signal by a respective phase shift, and the respective PA 110(1)-110(N) amplifies the respective phase-shifted signal for transmission. Each transmit chain 310(1)-310(N) outputs the respective output signal to the respective antenna 114(1)-114(N) of the antenna array for wireless transmission. The phase shifts $P_1$ to $P_N$ of the phase shifters 220(1)-220(N) are set by the beamformer controller 250 according to a selected transmit beam direction for the antenna array, as discussed above.

In the example in FIG. 3, the transmitter 302 uses the DPD 104 in an open-loop configuration. That is, the predistortion coefficients of the DPD 104 are predetermined and may be set in advance (e.g., at a factory location). In this regard, the predetermined predistortion coefficients may be stored in a memory 430 coupled to the DPD controller 124. In operation, the DPD controller 124 retrieves the stored predistortion coefficients from the memory 430, and inputs the retrieved predistortion coefficients to the DPD 104 to configure the non-linear response of the DPD 104 according to the retrieved predistortion coefficients. In contrast to the transmitter 202 illustrated in FIG. 2, the transmitter 302 in FIG. 3 does not include a separate feedback path for each transmit chain, which significantly reduces cost compared with the transmitter 202 in FIG. 2.

The predistortion coefficients of the DPD 104 may be determined during a calibration procedure (e.g., performed at a factory) and stored in the memory 430 on the transmitting device 300. In this regard, FIG. 4 shows an example of a calibration setup for determining the predistortion coefficients of the DPD 104 according to aspects of the present disclosure.

Figure 4:
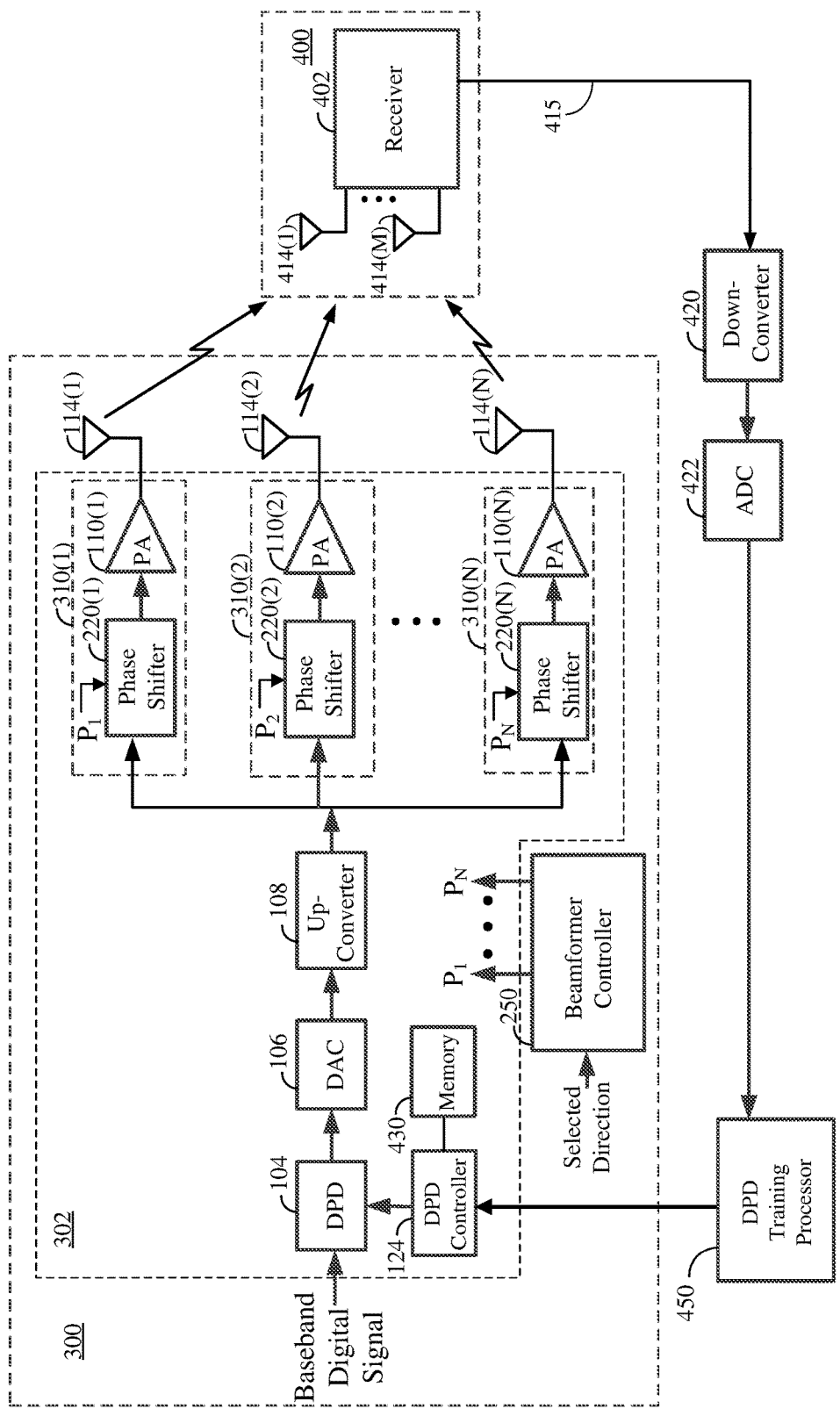
FIG. 4 illustrates an example of a setup for determining predistortion coefficients for the digital predistorter in FIG. 3 according to certain aspects of the present disclosure.

As shown in FIG. 4, the setup includes a test receiving device 400, a frequency down-converter 420, an ADC 422, and a DPD training processor 450. The test receiving device 400 includes a receiver 402, and one or more antennas 414(1)-414(M). Although the frequency down-converter 420 and the ADC 422 are shown being outside the receiver 402 in FIG. 4, it is to be appreciated that the frequency down-converter 420 and the ADC 422 may be part of the receiver 402. During the calibration procedure, the DPD training processor 450 may be coupled to the DPD controller 124 (e.g., via an interface (not shown)).

During calibration, the transmitter 302 transmits a test signal to the test receiving device 400 across a wireless channel using the antenna array. In this regard, the beamformer controller 250 may set the phase shifts $P_1$ to $P_N$ of the phase shifters 220(1)-220(N) to direct the transmit beam of the antenna array towards the test receiving device 400. The receiver 402 of the test receiving device 400 receives the corresponding transmit signals from the antennas of the antenna array of the transmitting device 300 via the one or more antennas 414(1)-414(M). The receiver 402 may amplify the signals (e.g., using one or more low-noise amplifiers (LNAs)), and perform beamforming if the one or more antennas 414(1)-414(M) include multiple antennas in an array. The receiver 402 combines the received signals into a combined receive signal 415.

The frequency down-converter 420 frequency down-converts the combined receive signal 415 into a baseband combined receive signal, and the ADC 422 converts the baseband combined receive signal into a digital combined receive signal, which is input to the DPD training processor 450. The digital combined receive signal provides the DPD training processor 450 with feedback on the combined receive signal at the receiver 402. In contrast, the feedback signals in the previous approach illustrated in FIG. 2 provide feedback of the output signals of the PAs in the transmitter 202.

The DPD training processor 450 then determines an amount of non-linear distortion in the combined receive signal 415 based on the digital combined receive signal. For example, the test signal transmitted by the transmitter 302 may be known by the DPD training processor 450. In this example, the DPD training processor 450 may determine the amount of non-linear distortion in the combined receive signal 415 based on a comparison of the digital combined receive signal and the known test signal transmitted by the transmitter 302. In another example, the DPD training processor 450 may be coupled to the output of the DPD 104. In this example, the DPD training processor 450 may determine the amount of non-linear distortion in the combined receive signal 415 based on a comparison of the digital combined receive signal and the test signal at the output of the DPD 104. The DPD training processor 450 may determine the amount of non-linear distortion in terms of error vector magnitude (EVM), adjacent channel leakage ratio (ACLR), and/or or other type of measurement.

The DPD training processor 450 may determine a set of predistortion coefficients for the DPD 104 during calibration by determining the amount of non-linear distortion at the receiver 402 for each one of a plurality of different sets of predistortion coefficients, and selecting the set of predistortion coefficients resulting in the least amount of non-linear distortion at the receiver 402. To do this, the DPD training processor 450 may instruct the DPD controller 124 to sequentially input each one of the different sets of predistortion coefficients to the DPD 104 to sequentially configure the non-linear response of the DPD 104 according to each one of the different sets of predistortion coefficients. For each one of the different sets of predistortion coefficients, the transmitter 202 transmits a test signal and the DPD training processor 450 determines the amount of non-linear distortion in the corresponding combined receive signal, as discussed above. Thus, the DPD training processor 450 determines the amount of non-linear distortion in the combined receive signal for each one of the different sets of predistortion coefficients. This way, the DPD training processor 450 determines the effect different sets of predistortion coefficients of the DPD 104 have on the non-linear distortion observed at the receiver 402. The DPD training processor 450 may then select the set of predistortion coefficients resulting in the least amount of non-linear distortion in the combined receive signal at the receiver 402.

The DPD training processor 450 may store the selected set of predistortion coefficients in the memory 430 for subsequent use by the DPD 104. During normal operation, the DPD controller 124 may retrieve the stored predistortion coefficients from the memory 430, and input the retrieved predistortion coefficients to the DPD 104 to configure the non-linear response of the DPD 104 according to the retrieved predistortion coefficients.

In this example, the calibration setup forms a closed-loop system during calibration in which the DPD training processor 450 adjusts the predistortion coefficients of the DPD 104 in the transmitter 302 while observing the effect the adjustment has on the non-linear distortion in the combined receive signal at the receiver 402. After calibration, the DPD training processor 450 may be decoupled from the transmitting device 300. During normal operation, the transmitter 302 operates in an open-loop configuration, in which the DPD controller 124 retrieves the set of predistortion coefficients determined during calibration from the memory 430, and inputs the retrieved predistortion coefficients to the DPD 104 to configure the non-linear response of the DPD 104 according to the retrieved set of predistortion coefficients.

In certain aspects, the DPD training processor 450 may determine a set of predistortion coefficients for each one of a plurality of different transmit beam directions. In this example, the DPD training processor 450 may instruct the beamformer controller 250 to sequentially set the transmit beam direction of the antenna array to each one the different transmit beam directions. As discussed above, the beamformer controller 250 sets the direction of the transmit beam by setting the phase shifts $P_1$ to $P_N$ of the phase shifters 220(1)-220(N) accordingly.

For each one of the transmit beam directions, the DPD training processor 450 performs the calibration procedure discussed above to determine a set of predistortion coefficients resulting in the least amount of non-linear distortion at the receiver 402. This way, the DPD training processor 450 determines a set of predistortion coefficients for each one of the transmit beam directions. The DPD training processor 450 stores the determined set of predistortion coefficients for each transmit beam direction in the memory 430 for subsequent use by the DPD 104. During normal operation, the DPD controller 124 may receive a signal (e.g., from the beamformer controller 250) indicating the current transmit beam direction of the array. The DPD controller 124 may then retrieve the set of predistortion coefficients corresponding to the current transmit beam direction from the memory 430, and input the retrieved predistortion coefficients to the DPD 104 to configure the non-linear response of the DPD 104 according to the retrieved set of predistortion coefficients.

Figure 5:
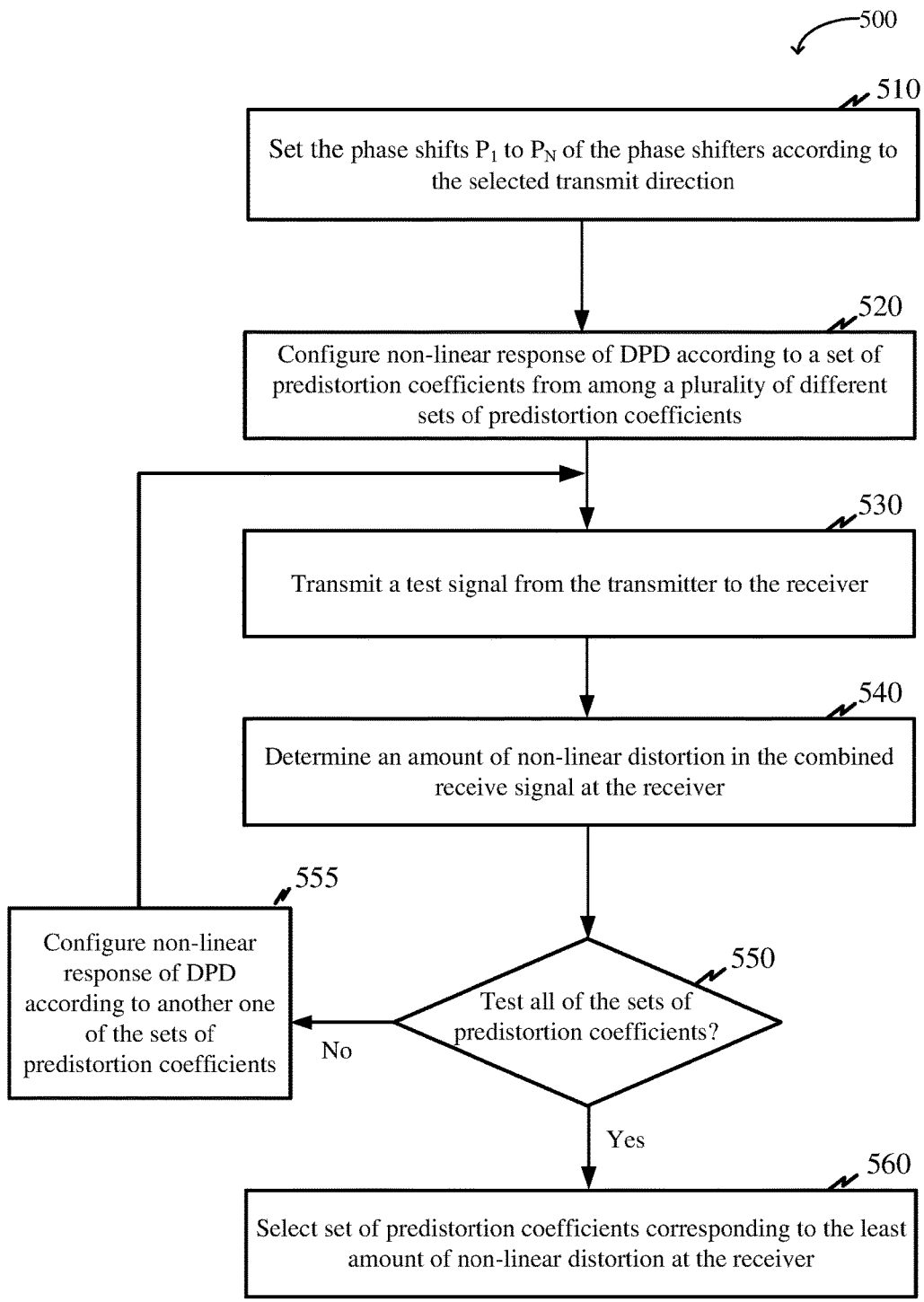
FIG. 5 illustrates an example of a calibration procedure for determining a set of predistortion coefficients according to certain aspects of the present disclosure.

FIG. 5 illustrates an exemplary calibration procedure 500 for determining a set of predistortion coefficients for a selected transmit beam direction. The calibration procedure may be performed using the calibration setup illustrated in FIG. 4. At step 510, the phase shifts $P_1$ to $P_N$ of the phase shifters 220(1)-220(N) are set according to the selected transmit beam direction. At step 520, the non-linear response of the DPD 104 is configured according to a set of predistortion coefficients from among a plurality of different sets of predistortion coefficients. At step 530, the transmitter 302 transmits a test signal to the receiver 402. At step 540, an amount of non-linear distortion in the corresponding combined receive signal 415 is determined. For example, the DPD training processor 450 may determine the amount of non-linear distortion from the digital combined receive signal from the ADC 422, as discussed above.

At step 550, a determination is made whether all of the sets of predistortion coefficients have been tested (i.e., the amount of non-linear distortion at the receiver has been determined for each set of predistortion coefficients). If not all of the sets of predistortion coefficients have been tested, then the procedure 500 proceeds to step 555, in which the non-linear response of the DPD 104 is configured according to another one of the sets of predistortion coefficients that has not already been tested. In this case, steps 530 and 555 are repeated for the other set of predistortion coefficients to determine the amount of non liner non-linear distortion at the receiver 402 for the other set of predistortion coefficients. If all of the sets of predistortion coefficients have been tested, then the procedure 500 proceeds to step 560, in which the set of predistortion coefficients corresponding to the least amount of non-linear distortion at the receiver 402 is selected. In this regard, the selected set of predistortion coefficients may be stored in the memory 430 for subsequent use by the DPD 104 for the selected transmit direction.

The calibration procedure 500 illustrated in FIG. 5 may be repeated for each one of the plurality of different transmit beam directions to determined a set of predistortion coefficients for each one of the different transmit beam directions. The determined set of predistortion coefficients for each transmit beam direction may be stored in the memory 430 for subsequent use by the DPD 104, as discussed above.

Figure 6:
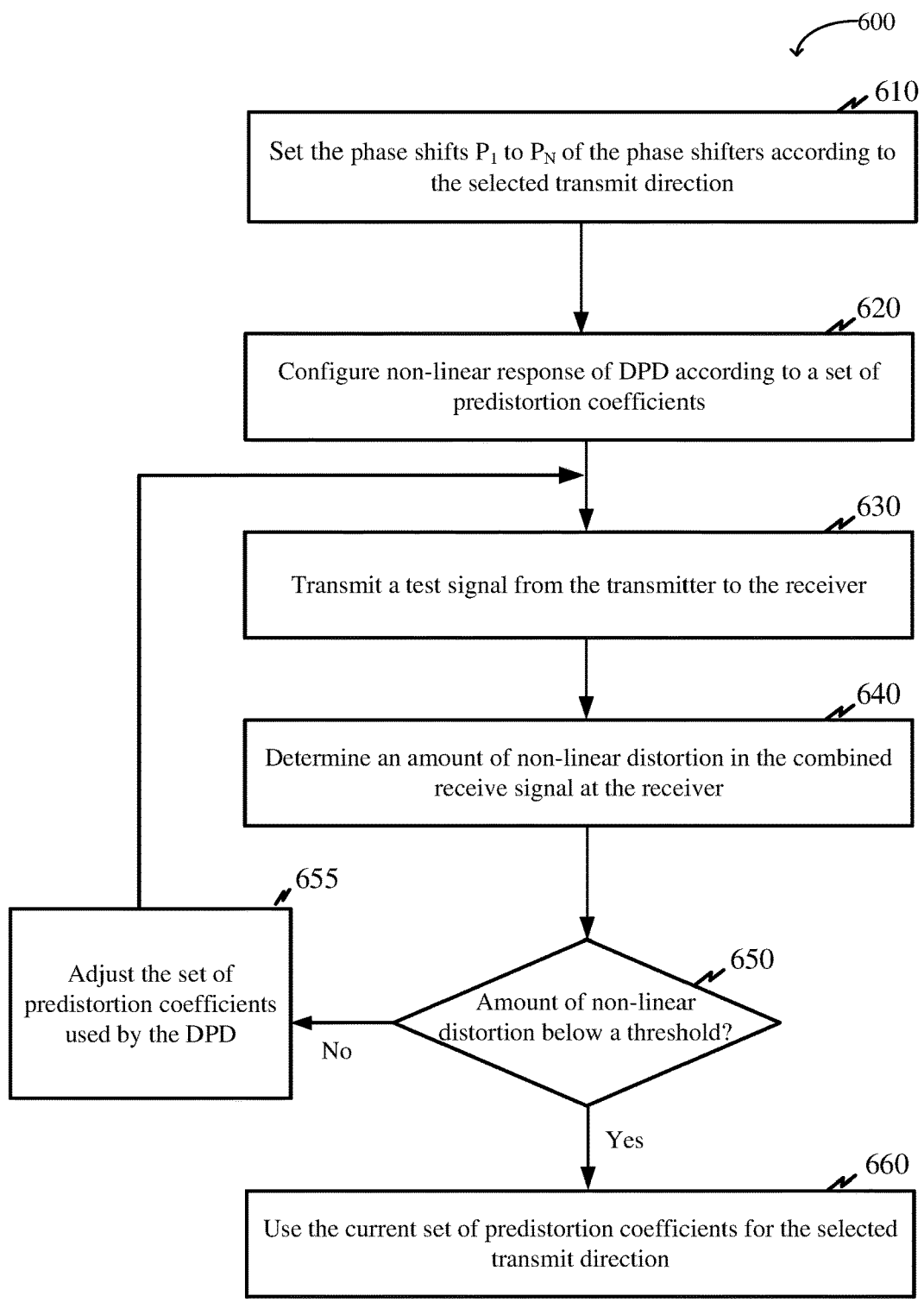
FIG. 6 illustrates another example of a calibration procedure for determining a set of predistortion coefficients according to certain aspects of the present disclosure.

FIG. 6 illustrates another exemplary calibration procedure 600 for determining a set of predistortion coefficients for a selected transmit beam direction. The calibration procedure may be performed using the calibration setup illustrated in FIG. 4. At step 610, the phase shifts $P_1$ to $P_N$ of the phase shifters 220(1)-220(N) are set according to the selected transmit beam direction. At step 620, the non-linear response of the DPD 104 is configured according to an initial set of predistortion coefficients. At step 630, the transmitter 302 transmits a test signal to the receiver 402. At step 640, an amount of non-linear distortion in the corresponding combined receive signal 415 is determined. For example, the DPD training processor 450 may determine the amount of non-linear distortion from the digital combined receive signal from the ADC 422, as discussed above.

At step 650, a determination is made whether the amount of non-linear distortion for the current set of predistortion coefficients is below a threshold. The threshold may be set, for example, according to an acceptable level of non-linear distortion that can be tolerated at the receiver 402 (e.g., a level at which the receiving device 400 is still able to recover data from a received signal). If the amount of non-linear distortion for the current set of predistortion coefficients is above the threshold, then the procedure 600 proceeds to step 655, in which the set of predistortion coefficients used by the DPD to configure its non-linear response is adjusted. The adjustment may include changing one or more of the predistortion coefficients. In this case, steps 630 and 640 are repeated for the adjusted set of predistortion coefficients to determine the amount of non-linear distortion at the receiver 402 for the adjusted set of predistortion coefficients. If the amount of non-linear distortion for the current set of predistortion coefficients is below the threshold, then the procedure 600 proceeds to step 660, in which the current set of predistortion coefficients is used for the selected transmit direction. This is indicative that the current set of predistortion coefficients provide a sufficient amount of non-linear distortion cancellation. In this regard, the current set of predistortion coefficients may be stored in the memory 430 for subsequent use by the DPD 104 for the selected transmit direction. If the determined amount of non-linear distortion is equal to the threshold, then the procedure 600 may adjust the set of coefficients and repeat steps 630 and 640, or proceed to step 660. Adjusting the set of coefficients may involve adjusting one or more of the coefficients.

The calibration procedure 600 illustrated in FIG. 6 may be repeated for each one of the plurality of different transmit beam directions to determine a set of predistortion coefficients for each one of the different transmit beam directions. The determined set of predistortion coefficients for each transmit beam direction may be stored in the memory 430 for subsequent use by the DPD 104, as discussed above.

Figure 7:
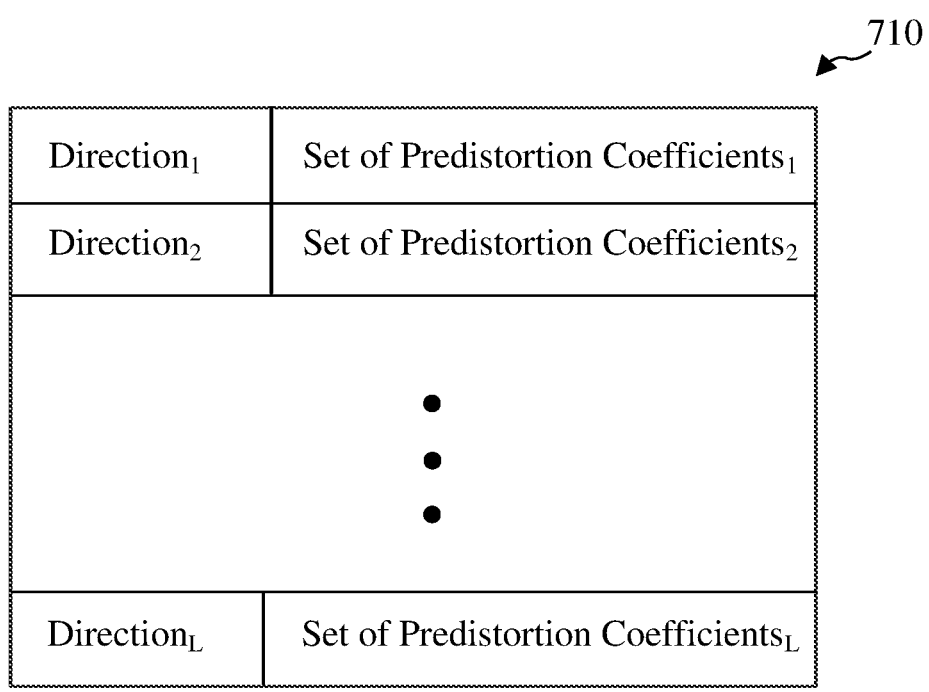
FIG. 7 illustrates an example of a lookup table for storing predistortion coefficients for different transmit beam directions according to certain aspects of the present discourse.

The sets of predistortion coefficients for the different transmit beam directions may be stored in a lookup table in the memory 430. In this regard, FIG. 7 illustrates an exemplary lookup table 710 stored in the memory 430. The table 710 includes L sets of predistortion coefficients for L transmit beam directions, where L is the number of different transmit beam directions. In operation, the DPD controller 124 receives a signal indicating the selected transmit beam direction of the antenna array. The DPD controller 124 then retrieves the set of predistortion coefficients corresponding to the selected transmit beam direction from the lookup table 710, and inputs the retrieved predistortion coefficients to the DPD 104 to configure the non-linear response of the DPD 104 according to the retrieved set of predistortion coefficients.

As discussed above, the beamformer controller 250 sets the phase shifts $P_1$ to $P_N$ of the phase shifters 220(1) to 220(N) to point the transmit beam of the array in a selected direction. The direction may be determined, for example, using beam training. In this example, the beamformer controller 250 may sequentially point the transmit beam in a plurality of different directions during a training procedure, and the transmitter 302 may transmit a training signal in each one of the different transmit directions to a target receiving device. The receiving device may measure the receive signal strength (e.g., signal-to-noise ratio (SNR), receive signal strength indicator (RSSI), etc.) of each training signal. The receiving device may then select the transmit direction resulting in the highest measured signal strength, and communicate the selected direction to the beamformer controller 250 (e.g., via a wireless link). In another example, the receiving device may report its location to the beamformer controller 250 (e.g., via a wireless link). In this example, the beamformer controller 250 may determine the direction of the receiving device relative to the transmitting device 300 based on the reported location of the receiving device and the location of the transmitting device 300. It is to be appreciated that the present disclosure is not limited to the above examples, and that the transmit direction may be determining using other techniques. After the transmit direction is determined, the DPD controller 124 may retrieve the set of predistortion coefficients corresponding to the determined transmit beam direction from the memory 430, and input the retrieved predistortion coefficients to the DPD 104 to configure the non-linear response of the DPD 104 according to the retrieved set of predistortion coefficients.

Figure 8:
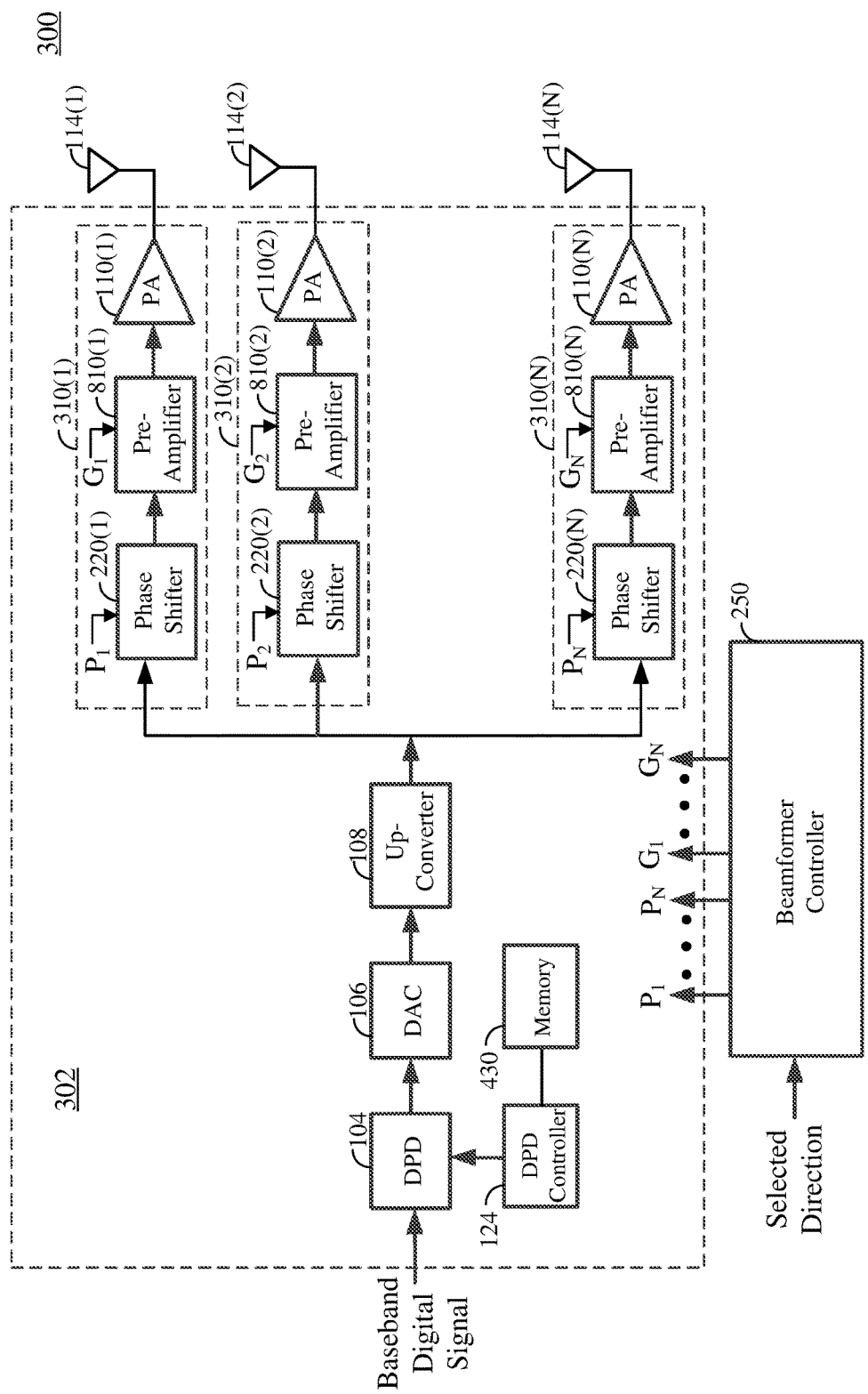
FIG. 8 illustrates an example of a transmitter including a digital predistorter that is shared by multiple transmit chains and a variable-gain amplifier in each of the transmit chains according to aspects of the present disclosure.

In certain aspects, the transmitter 302 may employ beamforming to direct the transmit beam towards a receiving device and shape the beam to increase the transmission power directed to the receiving device. In these aspects, the beamformer controller 250 adjusts both a phase shift and a gain of each transmit chain 310(1)-310(N) according to the selected transmit beam direction. In this regard, FIG. 8 shows an example in which each transmit chain 310(1)-310(N) further includes a respective variable-gain pre-amplifier 810(1)-810(N). In this example, the beamformer controller 250 may independently set the gain (labeled $G_1$ to $G_N$) of each variable-gain pre-amplifier 810(1)-810(N) according to the selected transmit beam direction. The variable-gain pre-amplifiers 810(1)-810(N) allow the beamformer controller 250 to independently control the output transmission power of each PA according to the selected transmit beam direction. This is because the gain of each variable-gain pre-amplifier 810(1)-810(N) controls the power level that is input to the respective PA 110(1)-110(N), which in turns controls the output transmission power of the respective PA 110(1)-110(N). For ease of illustration, the individual connections between the beamformer controller 250 and the variable-gain pre-amplifiers 810(1)-810(N) are not shown in FIG. 8.

Predistortion coefficients for the transmitter 302 illustrated in FIG. 8 can be determined using the calibration procedures and calibration setup discussed above with reference to FIG. 4. For example, a set of predistortion coefficients may be determined for each one of a plurality of different transmit beam directions by performing the exemplary calibration procedure 500 illustrated in FIG. 5 for each transmit beam direction. In this example, the gains $G_1$ to $G_N$ of the variable-gain pre-amplifiers 810(1)-810(N) are set according to the selected transmit beam direction in step 510. In another example, a set of predistortion coefficients may be determined for each one of a plurality of different transmit beam directions by performing the exemplary calibration procedure 600 illustrated in FIG. 6 for each transmit beam direction. In this example, the gains $G_1$ to $G_N$ of the variable-gain pre-amplifiers 810(1)-810(N) are set according to the selected transmit beam direction in step 610.

Figure 9:
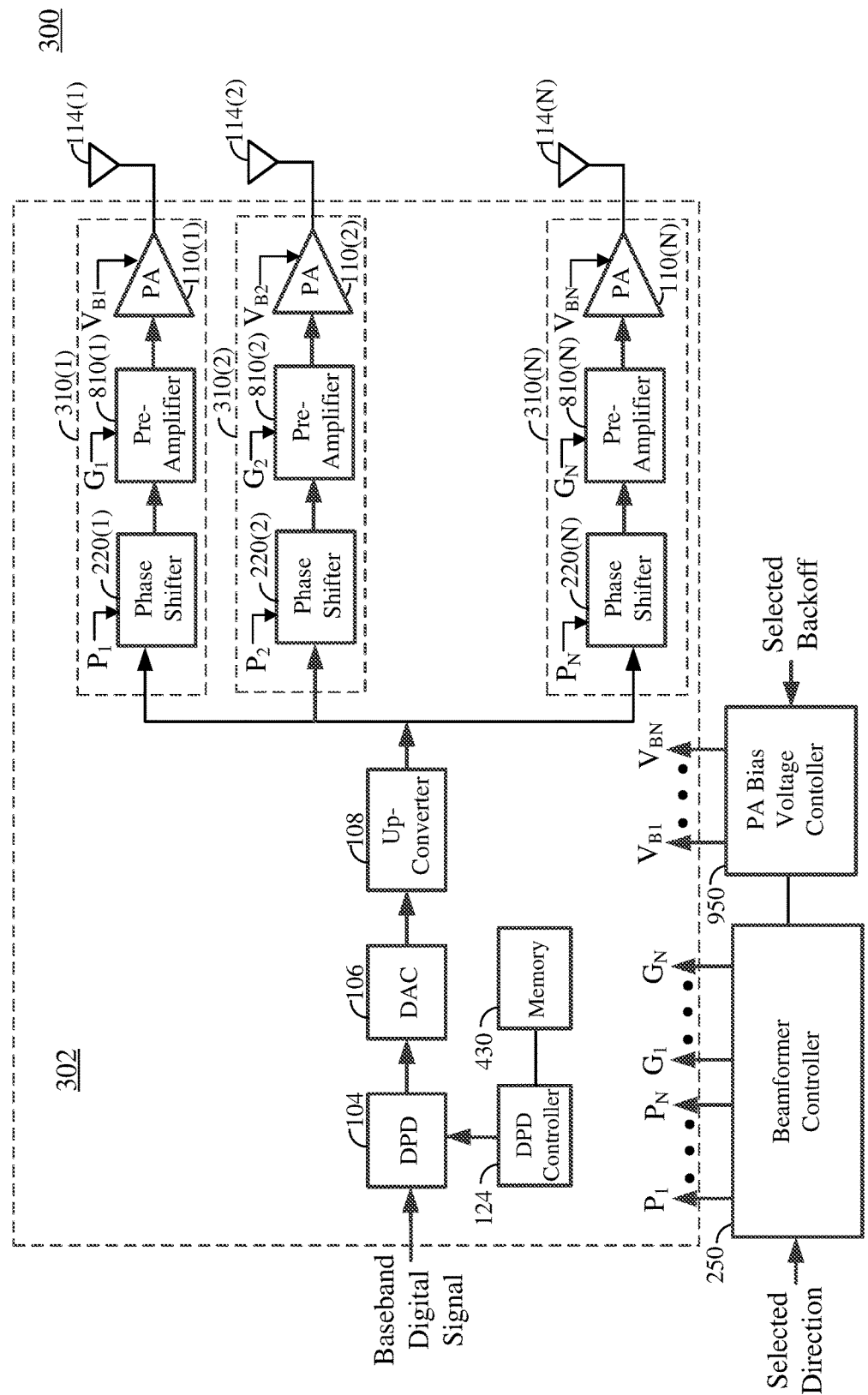
FIG. 9 illustrates an example of a transmitter including a digital predistorter that is shared by multiple transmit chains and a power amplifier with an adjustable bias voltage in each of the transmit chains according to aspects of the present disclosure.

In certain aspects, the saturation levels of the PAs 110(1)-110(N) may be independently set such that the PAs 110(1)-110(N) have approximately the same backoff value. Having the PAs 110(1)-110(N) operate with approximately the same backoff reduces differences between the non-linear characteristics of the PAs 110(1)-110(N). In this regard, FIG. 9 shows an example in which each PA 110(1)-110(N) receives a respective bias voltage (labeled $V_{B1}$ to $V_{BN}$) that controls the saturation level of the PA 110(1)-110(N).

In this example, the transmitting device 300 also includes a PA bias voltage controller 950 configured to set the saturation levels of the PAs 110(1)-110(N) by setting the respective bias voltages $V_{B1}$ to $V_{BN}$ accordingly. In one aspect, the bias voltage controller 950 sets the saturation levels of the PAs 110(1)-110(N) to achieve approximately the same backoff value across the PAs 110(1)-110(N), as discussed further below.

In operation, the beamformer controller 250 sets the gains $G_1$ to $G_N$ of the variable-gain pre-amplifiers 810(1)-810(N) according to the selected transmit beam direction of the antenna array. Since the gain of each variable-gain pre-amplifier 810(1)-810(N) controls the power level that is input to the respective PA 110(1)-110(N), the gain of each variable-gain pre-amplifier 810(1)-810(N) also controls the output transmission power of the respective PA 110(1)-110(N). Assuming the gains of the variable-gain pre-amplifiers 810(1)-810(N) vary across the transmit chains 310(1)-310(N), this causes the output transmission powers of the PAs 110(1)-110(N) to also vary across the transmit chains 310(1)-310(N).

The bias voltage controller 950 may determine the output transmission powers of the PAs 110(1)-110(N) based on the gains set by the beamformer controller 250. The bias voltage controller 950 may then set the saturation levels of the PAs 110(1)-110(N) based on the determined output transmission powers of the PAs 110(1)-110(N) to achieve approximately the same backoff value across the PAs 110(1)-110(N). More particularly, the bias voltage controller 950 may set the saturation level of each PA above the respective output transmission power by an amount approximately equal to a selected backoff value by setting the respective bias voltage accordingly. For example, if a first one of the PAs has an output transmission power of 20 dBm, a second one of the PAs has an output transmission power of 15 dBm and the selected backoff value is 4 dBm, then the bias voltage controller 950 may set the saturation level of the first one of the PAs to 24 dBm and set the saturation level of the second one of the PAs to 19 dBm by setting their respective bias voltages accordingly.

In certain aspects, the bias voltages $V_{B1}$ to $V_{BN}$ for the PAs 110(1)-110(N) may be determined in advanced for different transmit beam directions and backoff values using the method discussed above, and stored in a memory (e.g., memory 430). In this example, the bias voltage controller 950 receives signals indicating the selected transmit beam direction and backoff value. The bias voltage controller 950 then retrieves the bias voltages $V_{B1}$ to $V_{BN}$ for the selected transmit beam direction and backoff value from the memory and applies the retrieved bias voltages $V_{B1}$ to $V_{BN}$ to the respective PAs 110(1)-110(N).

Predistortion coefficients for the transmitter 302 illustrated in FIG. 9 can be determined using the calibration procedures and calibration setup discussed above with reference to FIG. 4. For example, a set of predistortion coefficients may be determined for a selected transmit beam direction and backoff value using the exemplary calibration procedure 500 illustrated in FIG. 5. In this example, the gains $G_1$ to $G_N$ of the variable-gain pre-amplifiers 810(1)-810(N) are set according to the selected transmit beam direction at step 510. In addition, the saturation levels of the PAs 110(1)-110(N) are set using the respective bias voltages $V_{B1}$ to $V_{BN}$ such that the backoff values of the PAs 110(1)-110(N) are approximately equal to the selected backoff value. After the transmit beam is set to the selected transmit beam direction and the backoff values of the PAs 110(1)-11(N) are set to the selected backoff value, the calibration procedure 500 may proceed to step 520 to determine the set of predistortion coefficients, as discussed above.

The calibration procedure 500 illustrated in FIG. 5 may be repeated for different combinations of transmit beam directions and backoff values to determine sets of predistortion coefficients for the different combinations of transmit beam directions and backoff values. The determined sets of predistortion coefficients may be stored in the memory 430 for subsequent use by the DPD 104, as discussed further below.

In another example, a set of predistortion coefficients may be determined for a selected transmit beam direction and backoff value using the exemplary calibration procedure 600 illustrated in FIG. 6. In this example, the gains $G_1$ to $G_N$ of the variable-gain pre-amplifiers 810(1)-810(N) are set according to the selected transmit beam direction at step 610. In addition, the saturation levels of the PAs 110(1)-110(N) are set using the respective bias voltages $V_{B1}$ to $V_{BN}$ such that the backoff values of the PAs 110(1)-110(N) are approximately equal to the selected backoff value. After the transmit beam is set to the selected transmit beam direction and the backoff values of the PAs 110(1)-11(N) are set to the selected backoff value, the calibration procedure 600 may proceed to step 620 to determine the set of predistortion coefficients, as discussed above.

The calibration procedure 600 illustrated in FIG. 6 may be repeated for different combinations of transmit beam directions and backoff values to determine sets of predistortion coefficients for the different combinations of transmit beam directions and backoff values. The determined sets of predistortion coefficients may be stored in the memory 430 for subsequent use by the DPD 104, as discussed further below.

The sets of predistortion coefficients for different combinations of transmit beam directions and backoff values may be stored in a lookup table in the memory 430. In this regard, FIG. 10 illustrates an exemplary lookup table 1010 stored in the memory 430. For each one of K different backoff values, the lookup table 1010 includes L sets of predistortion coefficients for L transmit beam directions. In the table 1010, each set of predistortion coefficients is indexed by two numbers, where the first number indicates the corresponding backoff value and the second number indicates the corresponding transmit beam direction.

In operation, the DPD controller 124 receives signals indicating the selected transmit beam direction and the selected backoff value. The DPD controller 124 then retrieves the set of predistortion coefficients corresponding to the selected transmit beam direction and selected backoff value from the lookup table 1010, and inputs the retrieved predistortion coefficients to the DPD 104 to configure the non-linear response of the DPD 104 according to the retrieved set of predistortion coefficients.

The transmit beam direction can be selected based on the direction of the target receiving device relative to the transmitting device 300, as discussed above. The target receiving device is a receiving device that is in communication with the transmitting device 300. For a WiFi example where communication is between an access point (AP) and a station (STA), the transmitting device 300 may be incorporated in the AP and the receiving device may be incorporated in the STA, or vice versa.

Figure 11:
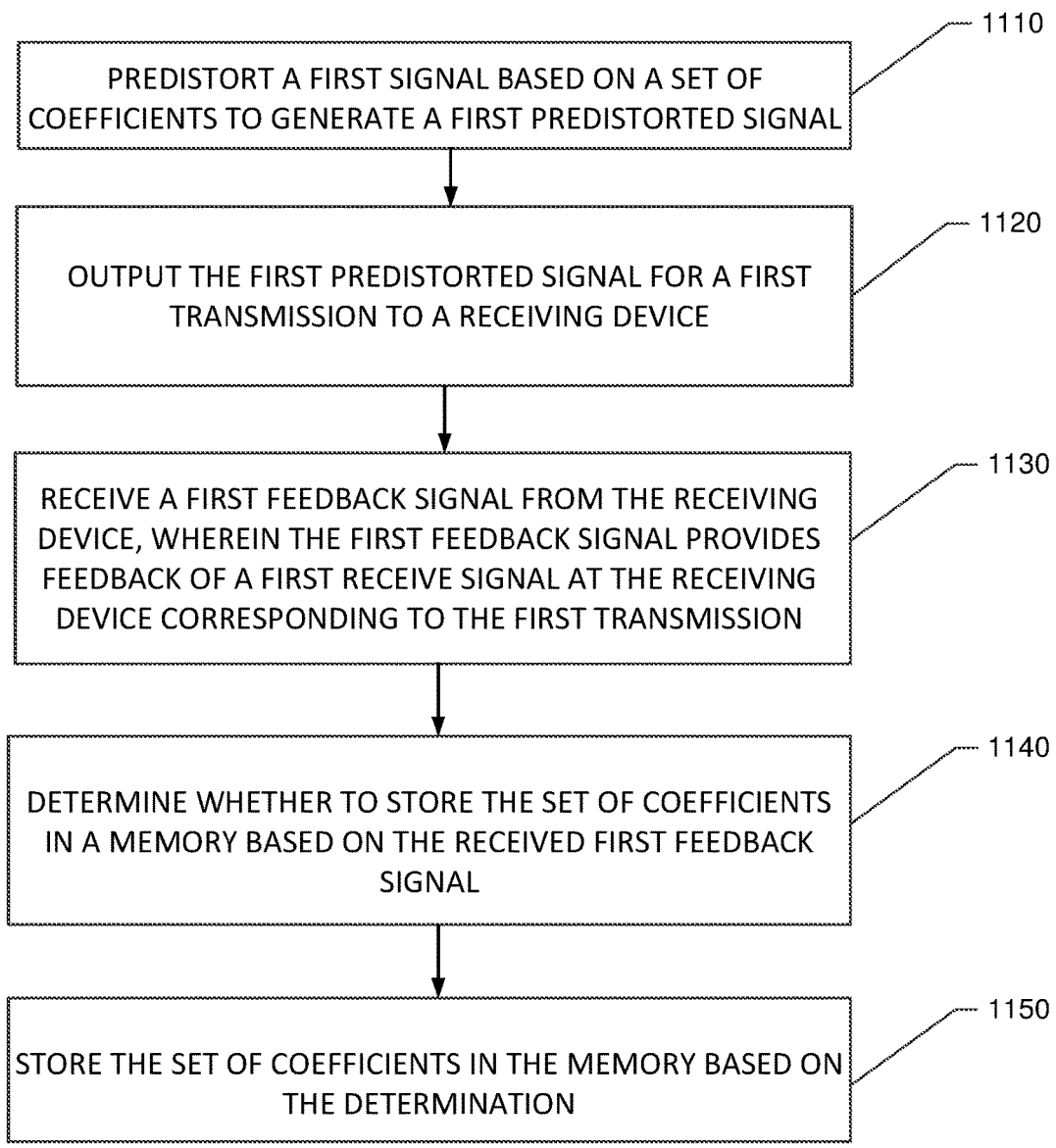
FIG. 11 is a flowchart illustrating an exemplary method for wireless communications according to aspects of the present disclosure.

FIG. 11 illustrates an exemplary method 1100 for wireless communications according to certain aspects of the present disclosure. The method may be performed by the transmitter 302, the DPD controller 124, and/or the DPD training processor 450.

At step 1110, a first signal is predistorted based on a set of coefficients to generate a first predistorted signal. For example, the first signal may be predistorted by a predistorter (e.g., DPD 104) based on the set of coefficients (e.g., predistortion coefficients), in which set of coefficients configures a non-linear response of the predistorter. The first signal may comprise a baseband signal.

At step 1120, the first predistorted signal is output for a first transmission to a receiving device. For example, the first predistorted signal may be transmitted to the receiving device via multiple transmit chains. In this example, each of the transmit chains (e.g., transmit chains 310(1)-310(N)) may include a respective power amplifier (e.g., PA 110(1)-110(N)). The first predistorted signal may be converted to an analog predistorted signal and/or frequency up-converted before being output to the transmit chains.

At step 1130, a first feedback signal is received from the receiving device, wherein the first feedback signal provides feedback of a first receive signal at the receiving device corresponding to the first transmission. The first receive signal may correspond to a combined receive signal (e.g., combined receive signal 415) of a receiver (e.g., receiver 402) of the receiving device.

At step 1140, a determination is made whether to store the set of coefficients in a memory based on the received first feedback signal. For example, an amount of non-linear distortion in the first receive signal may be determined based on the first feedback signal (e.g., in terms of error vector magnitude (EVM), adjacent channel leakage ratio (ACLR), and/or or other type of measurement). In this example, the determined amount of non-linear distortion may be compared to a threshold.

At step 1150, the set of coefficients is stored in the memory based on the determination. For example, the set of coefficients may be stored in the memory if the comparison indicates the determined amount of non-linear distortion is below the threshold. This may be indicative that the set of coefficients provide a sufficient amount of non-linear distortion cancellation for subsequent wireless communications.

The method 1100 may be repeated for each one of a plurality of different beam directions to determine a set of coefficients for each beam direction. In another example, the method 1100 may be repeated for each one of a plurality of different combinations of backoff values and beam directions (e.g., to generate the table 1010 shown in FIG. 10).

Figure 12:
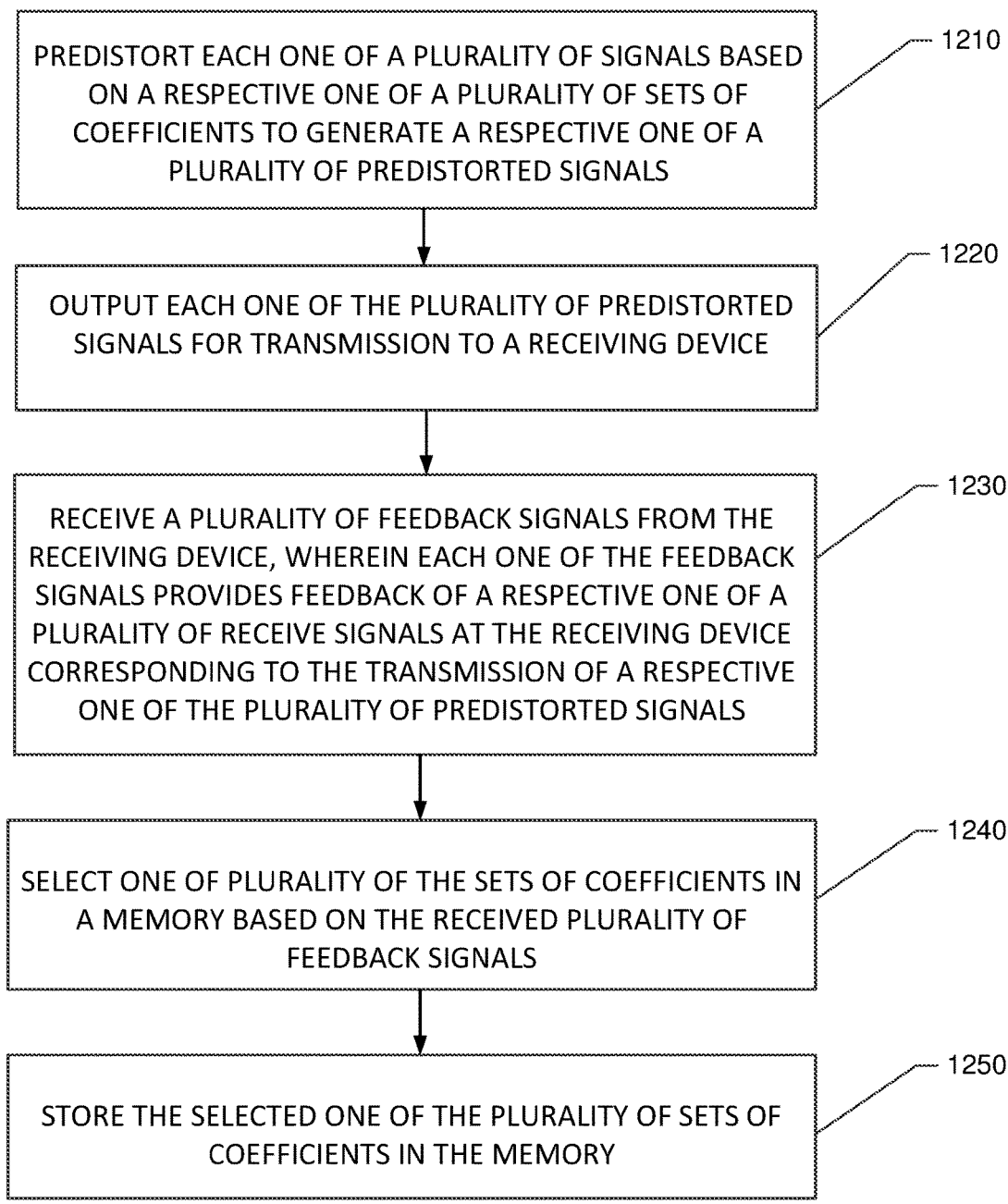
FIG. 12 is a flowchart illustrating another exemplary method for wireless communications according to aspects of the present disclosure.

FIG. 12 illustrates an exemplary method 1200 for wireless communications according to certain aspects of the present disclosure. The method may be performed by the transmitter 302, the DPD controller 124, and/or the DPD training processor 450.

At step 1210, each one of a plurality of signals is predistorted based on a respective one of a plurality of sets of coefficients to generate a respective one of a plurality of predistorted signals. For example, each signal may be predistorted by a predistorter (e.g., DPD 104) at a different time based on the respective set of coefficients (e.g., predistortion coefficients). Each signal may comprise a baseband signal.

At step 1220, each one of the plurality of predistorted signals is outputted for transmission to a receiving device. For example, the predistorted signals may be outputted one at a time.

At step 1230, a plurality of feedback signals are received from the receiving device, wherein each one of the plurality of feedback signals provides feedback of a respective one of a plurality of receive signals at the receiving device corresponding to the transmission of a respective one of the plurality of predistorted signals. For example, the feedback signals may be received one at a time.

At step 1240, one of the plurality of sets of coefficients is selected based on the plurality of feedback signals. For example, for each set of coefficients, an amount of non-linear distortion may be determined based on the corresponding feedback signal. In this example, the set of coefficients corresponding to the lowest determined amount of non-linear distortion may be selected.

At step 1250, the selected one of the plurality of sets of coefficients is stored in a memory. The selected one of the plurality of sets of coefficients may be used for subsequent transmissions to predistort a communication signal.

The techniques described herein may be used for various broadband wireless communication systems, including communication systems that are based on a single-carrier or an orthogonal multiplexing scheme. Examples of such communication systems include Spatial Division Multiple Access (SDMA), Time Division Multiple Access (TDMA), Orthogonal Frequency Division Multiple Access (OFDMA) systems, Single-Carrier Frequency Division Multiple Access (SC-FDMA) systems, and so forth. An SDMA system may utilize sufficiently different directions to simultaneously transmit data belonging to multiple user terminals. A TDMA system may allow multiple user terminals to share the same frequency channel by dividing the transmission signal into different time slots, each time slot being assigned to different user terminal. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IF-DMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

The teachings described herein may be incorporated into (e.g., implemented within or performed by) a variety of wired or wireless apparatuses (e.g., nodes). In some aspects, a wireless node implemented in accordance with the teachings herein may comprise an access point or an access terminal.

An access point ("AP") may comprise, be implemented as, or known as a Node B, Radio Network Controller ("RNC"), evolved Node B (eNB), Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology.

An access terminal ("AT") may comprise, be implemented as, or known as a subscriber station, a subscriber unit, a mobile station (MS), a remote station, a remote terminal, a user terminal (UT), a user agent, a user device, user equipment (UE), a user station, or some other terminology. In some implementations, an access terminal may comprise a cellular telephone, a cordless telephone, a Session Initiation Protocol ("SIP") phone, a wireless local loop ("WLL") station, a personal digital assistant ("PDA"), a handheld device having wireless connection capability, a Station ("STA"), or some other suitable processing device connected to a wireless modem. Accordingly, one or more aspects taught herein may be incorporated into a phone (e.g., a cellular phone or smart phone), a computer (e.g., a laptop), a tablet, a portable communication device, a portable computing device (e.g., a personal data assistant), an entertainment device (e.g., a music or video device, or a satellite radio), a global positioning system (GPS) device, or any other suitable device that is configured to communicate via a wireless or wired medium. In some aspects, the node is a wireless node. Such wireless node may provide, for example, connectivity for or to a network (e.g., a wide area network such as the Internet or a cellular network) via a wired or wireless communication link.

Figure 13:
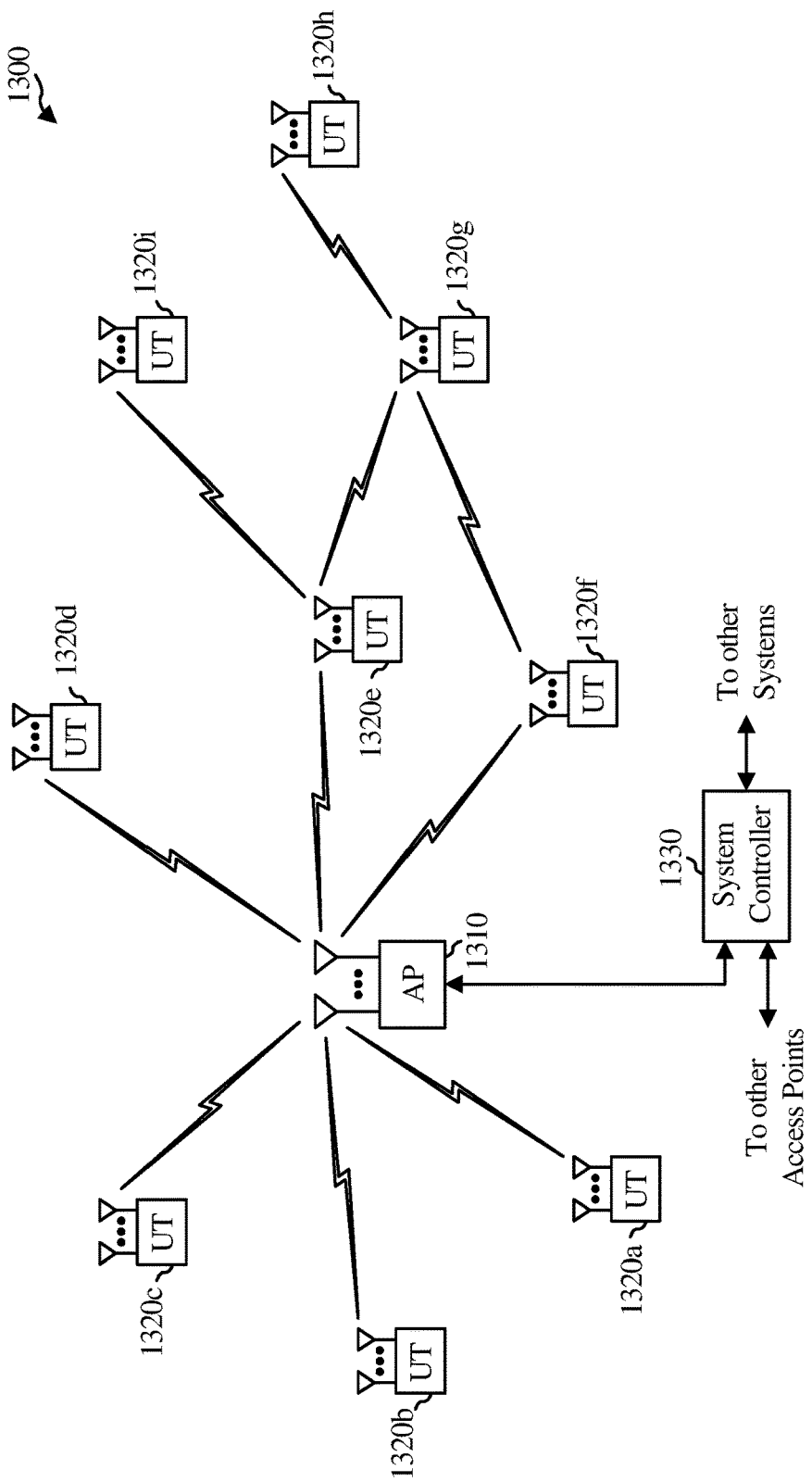
FIG. 13 illustrates an exemplary wireless communications network, in which aspects of the present disclosure may be implemented.

FIG. 13 illustrates an example of a multiple-access multiple-input multiple-output (MIMO) system 1300 with access points and user terminals in which aspects of the present disclosure may be practiced. Additionally or alternatively, aspects of the present disclosure may be implemented within beamforming systems. For the MIMO example of FIG. 13, access point 1310 or user terminals 1320 may include transmitters with the common DPD configured as described above. For simplicity, only one access point 1310 is shown in FIG. 13. An access point is generally a fixed station that communicates with the user terminals and may also be referred to as a base station or some other terminology. A user terminal may be fixed or mobile and may also be referred to as a mobile station, a wireless device, or some other terminology. Access point 1310 may communicate with one or more user terminals 1320 at any given moment on the downlink and uplink. The downlink (i.e., forward link) is the communication link from the access point 1310 to the user terminals 1320, and the uplink (i.e., reverse link) is the communication link from the user terminals 1320 to the access point 1310. A user terminal may also communicate peer-to-peer with another user terminal. A system controller 1330 couples to and provides coordination and control for the access points 1310.

Figure 14:
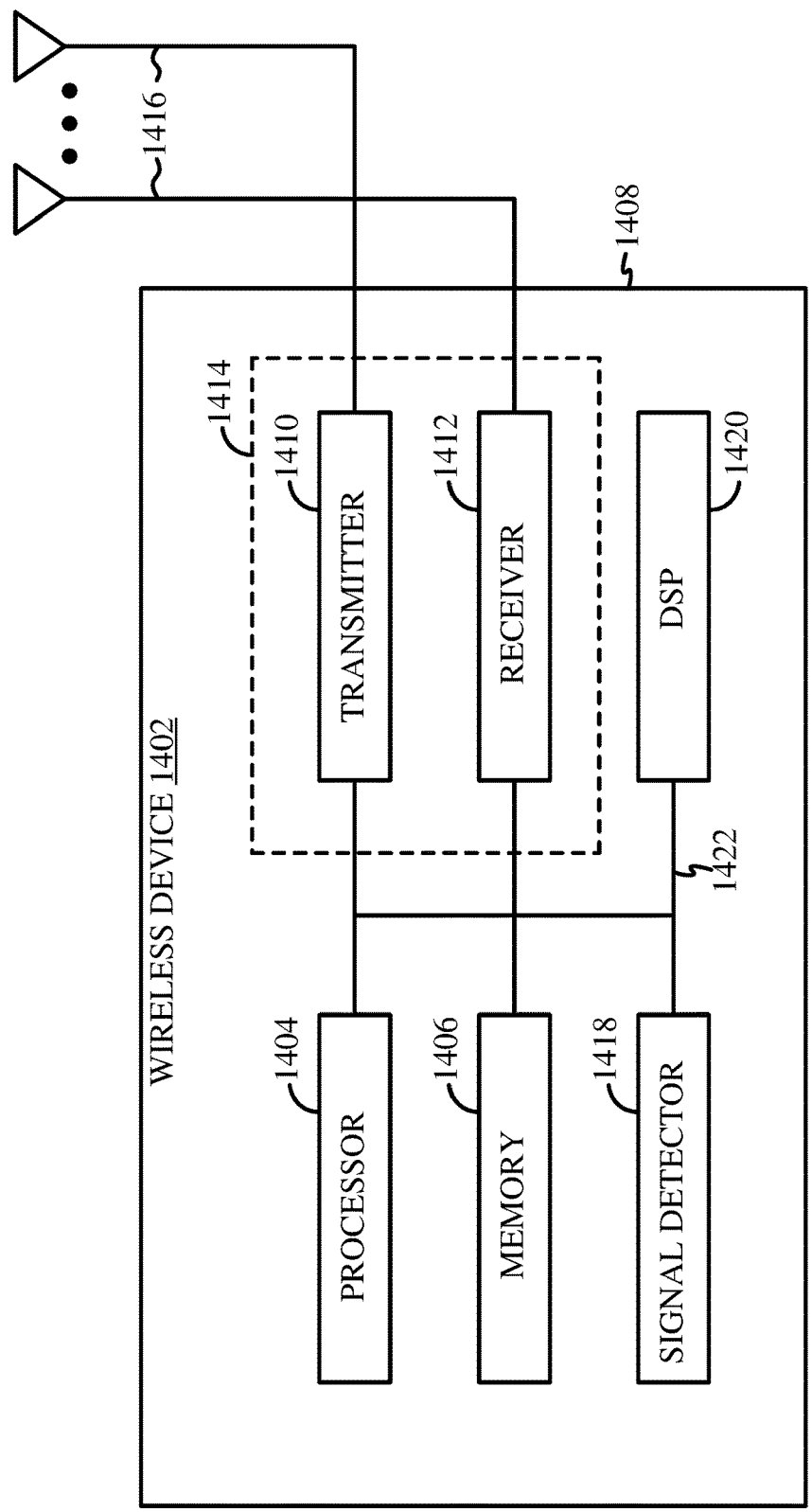
FIG. 14 illustrates an exemplary wireless device, in which aspects of the present disclosure may be implemented.

FIG. 14 illustrates various components that may be utilized in a wireless device 1402 in which aspects of the present disclosure may be practiced and that may be employed within the MIMO system 1300. The wireless device 1402 is an example of a device that may be configured to implement the various methods described herein. The wireless device 1402 may be an access point 1310 or a user terminal 1320.

The wireless device 1402 may include a processor 1404 which controls operation of the wireless device 1402. The processor 1404 may also be referred to as a central processing unit (CPU). Memory 1406, which may include both read-only memory (ROM) and random access memory (RAM), provides instructions and data to the processor 1404. A portion of the memory 1406 may also include non-volatile random access memory (NVRAM). The processor 1404 typically performs logical and arithmetic operations based on program instructions stored within the memory 1406. The instructions in the memory 1406 may be executable to implement the methods described herein. Processor 1404 may, for example, direct all or some of the operations of the various flowcharts of the drawings to implement the DPD controller 124, the digital predistorter 104, beamformer controller 250, bias voltage controller 950 and/or other features of the present disclosure.

The wireless device 1402 may also include a housing 1408 that may include a transmitter 1410 and a receiver 1412 to allow transmission and reception of data between the wireless device 1402 and a remote location. The transmitter 1410 and receiver 1412 may be combined into a transceiver 1414. A single or a plurality of transmit antennas 1416 may be attached to the housing 1408 and electrically coupled to the transceiver 1414. The wireless device 1402 may include multiple transmitters 1410, multiple receivers 1412, and multiple transceivers 1414. The transmitter 1410 may be equipped or configured as described above to perform the operations of the various flowcharts. In this example, the transmitter 1410 may implement the transmitter 302 according to any of the embodiments discussed above.

The wireless device 1402 may also include a signal detector 1418 that may be used in an effort to detect and quantify the level of signals received by the transceiver 1414. The signal detector 1418 may detect such signals as total energy, energy per subcarrier per symbol, power spectral density and other signals. The wireless device 1402 may also include a digital signal processor (DSP) 1420 for use in processing signals. The various components of the wireless device 1402 may be coupled together by a bus system 1422 (interface), which may include a power bus, a control signal bus, and a status signal bus in addition to a data bus.

Examples of means for predistorting a first signal based on a set of coefficients to generate a first predistorted signal include at least one of the DPD controller 124, the DPD 104, or the processor 1404. Examples of means for outputting the first predistorted signal for a first transmission to a receiving device include at least one of the transmit chains 310(1) to 310(N), the bus system 1422, or the transmitter 1410. Examples of means for receiving a first feedback signal from the receiving device, wherein the first feedback signal provides feedback of a first receive signal at the receiving device corresponding to the first transmission include at least one of the bus system 1422, or the receiver 1412. Examples of means for determining whether to store the set of coefficients in a memory based on the received first feedback signal include at least one of the DPD training processor 450, the DPD controller 124, or the processor 1404. Examples of means for storing the set of coefficients in the memory based on the determination include at least one of the DPD training processor 450, the DPD controller 124, or the processor 1404.

Examples of means for determining an amount of non-linear distortion in the first receive signal based on the received first feedback signal include at least one of the DPD training processor 450, the DPD controller 124, or the processor 1404. Examples of means for comparing the determined amount of non-linear distortion with a threshold include at least one of the DPD training processor 450, the DPD controller 124, or the processor 1404. Examples of means for storing the set of coefficients in the memory if the comparison indicates the determined amount of non-linear distortion is below the threshold include at least one of the DPD training processor 450, the DPD controller 124, or the processor 1404.

Examples of means for adjusting the set of coefficients if the comparison indicates the determined amount of non-linear distortion is above the threshold include at least one of the DPD training processor 450, the DPD controller 124, or the processor 1404. Examples of means for predistorting a second signal based on the adjusted set of coefficients to generate a second predistorted signal include at least one of the DPD controller 124, the DPD 104, or the processor 1404. Examples of means for outputting the second predistorted signal for a second transmission to the receiving device include at least one of the transmit chains 310(1) to 310(N), the bus system 1422, or the transmitter 1410. Examples of means for receiving a second feedback signal from the receiving device, wherein the second feedback signal provides feedback of a second receive signal at the receiving device corresponding to the second transmission include at least one of the bus system 1422, or the receiver 1412. Examples of means for determining an amount of non-linear distortion in the second receive signal based on the received second feedback signal include at least one of the DPD training processor 450, the DPD controller 124, or the processor 1404. Examples of means for comparing the determined amount of non-linear distortion in the second receive signal with the threshold include at least one of the DPD training processor 450, the DPD controller 124, or the processor 1404. Examples of means for storing the adjusted set of coefficients in the memory if the comparison indicates the determined amount of non-linear distortion in the second receive signal is below the threshold include at least one of the DPD training processor 450, the DPD controller 124, or the processor 1404.

Examples of means for retrieving the set of coefficients from the memory include at least one of include at least one of the DPD controller 124, or the processor 1404. Examples of means for predistorting a communication signal based on the retrieved set of coefficients to generate a predistorted communication signal include at least one of the DPD controller 124, the DPD 104, or the processor 1404. Examples of means for outputting the predistorted communication signal for transmission include at least one of the transmit chains 310(1) to 310(N), the bus system 1422, or the transmitter 1410.

Examples of means for predistorting each one of a plurality of signals based on a respective one of a plurality of sets of coefficients to generate a respective one of a plurality of predistorted signals include at least one of the DPD controller 124, the DPD 104, or the processor 1404. Examples of means for outputting each one of the plurality of predistorted signals for transmission to a receiving device include at least one of the transmit chains 310(1) to 310(N), the bus system 1422, or the transmitter 1410. Examples of means for receiving a plurality of feedback signals from the receiving device, wherein each one of the plurality of feedback signals provides feedback of a respective one of a plurality of receive signals at the receiving device corresponding to the transmission of a respective one of the plurality of predistorted signals include at least one of the bus system 1422, or the receiver 1412. Examples of means for selecting one of the plurality of sets of coefficients based on the plurality of feedback signals include at least one of the DPD training processor 450, the DPD controller 124, or the processor 1404. Examples of means for storing the selected one of the plurality of sets of coefficients in a memory include at least one of the DPD training processor 450, the DPD controller 124, or the processor 1404.

Examples of means for determining an amount of non-linear distortion for each one of the plurality of sets of coefficients based on the respective one of the plurality of feedback signals include at least one of the DPD training processor 450, the DPD controller 124, or the processor 1404. Examples of means for selecting the one of the plurality of sets of coefficients corresponding to a lowest determined amount of non-linear distortion include at least one of the DPD training processor 450, the DPD controller 124, or the processor 1404.

Examples of means for retrieving the selected one of the plurality of sets of coefficients from the memory include at least one of the DPD controller 124, or the processor 1404. Examples of means for predistorting a communication signal based on the retrieved selected one of the plurality of sets of coefficients to generate a predistorted communication signal include at least one of the DPD controller 124, the DPD 104, or the processor 1404. Examples of means for outputting the predistorted communication signal for transmission include at least one of the transmit chains 310(1) to 310(N), the bus system 1422, or the transmitter 1410.

As used herein, the term "generating" encompasses a wide variety of actions. For example, "generating" may include calculating, causing, computing, creating, determining, processing, deriving, investigating, making, producing, providing, giving rise to, leading to, resulting in, looking up (e.g., looking up in a table, a database or another data structure), ascertaining and the like. Also, "generating" may include receiving (e.g., receiving information), accessing (e.g., accessing data in a memory) and the like. Also, "generating" may include resolving, selecting, choosing, establishing and the like.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like. Also, "determining" may include measuring, estimating and the like.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any such list including multiples of the same members (e.g., any lists that include aa, bb, or cc).

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, EPROM memory, EEPROM memory, registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processor may be responsible for managing the bus and general processing, including the execution of software stored on the machine-readable media. The processor may be implemented with one or more general-purpose and/or special-purpose processors. Examples include microprocessors, microcontrollers, DSP processors, and other circuitry that can execute software. Software shall be construed broadly to mean instructions, data, or any combination thereof, whether referred to as software, firmware, middleware, microcode, hardware description language, or otherwise. Machine-readable media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product. The computer-program product may comprise packaging materials.

In a hardware implementation, the machine-readable media may be part of the processing system separate from the processor. However, as those skilled in the art will readily appreciate, the machine-readable media, or any portion thereof, may be external to the processing system. By way of example, the machine-readable media may include a transmission line, a carrier wave modulated by data, and/or a computer product separate from the wireless node, all which may be accessed by the processor through the bus interface. Alternatively, or in addition, the machine-readable media, or any portion thereof, may be integrated into the processor, such as the case may be with cache and/or general register files.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

The machine-readable media may comprise a number of software modules. The software modules include instructions that, when executed by the processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

If implemented in software, the functions may be stored or transmitted over as one or more instructions or code on a computer-readable medium. Computer-readable media include both computer storage media and communication media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For certain aspects, the computer program product may include packaging material.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An apparatus for wireless communications, comprising:
   a first processing system configured to configure a predistorter to predistort a first signal based on a first set of predistortion coefficients to generate a first predistorted signal;
   a transmitter configured to transmit the first predistorted signal in a first transmission to a receiving device; and
   a second processing system coupled with the first processing system via an interface and configured to:
      receive a first feedback signal from the receiving device, wherein the first feedback signal provides feedback of a first receive signal at the receiving device corresponding to the first transmission;
      determine a second set of predistortion coefficients based on the first feedback signal to the second processing system; and
      output the second set of predistortion coefficients to the first processing system for storage in a memory coupled to the first processing system.

2. The apparatus of claim 1, wherein the second processing system is further configured to:
   determine whether to output the second set of coefficients to the first processing system by:
      determining an amount of non-linear distortion in the first receive signal based on the received first feedback signal; and
      comparing the determined amount of non-linear distortion with a threshold;
   wherein the second processing system outputs the second set of predistortion coefficients to the first processing system if the comparison indicates the determined amount of non-linear distortion is above the threshold.

3. The apparatus of claim 2, wherein:
   the first processing system is further configured to adjust the first set of coefficients stored in the memory to the second set of predistortion coefficients when the comparison indicates the determined amount of non-linear distortion is above the threshold;
   the first processing system is further configured to configure the predistorter to predistort a second signal based on the second set of predistortion coefficients to generate a second predistorted signal;
   the transmitter is further configured to output the second predistorted signal for a second transmission to the receiving device;
   the second processing system is further configured to receive a second feedback signal from the receiving device, wherein the second feedback signal provides feedback of a second receive signal at the receiving device corresponding to the second transmission;
   the second processing system is further configured to determine an amount of non-linear distortion in the second receive signal based on the received second feedback signal;

the second processing system is further configured to compare the determined amount of non-linear distortion in the second receive signal with the threshold; and the second processing system is further configured to output a further adjusted set of coefficients to the first processing system if the comparison indicates the determined amount of non-linear distortion in the second receive signal is below the threshold.

4. The apparatus of claim 1, wherein, if the second set of predistortion coefficients is stored in the memory:

the first processing system is further configured to retrieve the second set of predistortion coefficients from the memory;

the first processing system is further configured to configure the predistorter to predistort a communication signal based on the retrieved second set of predistortion coefficients to generate a second predistorted communication signal; and the transmitter is further configured to output the second predistorted communication signal for transmission.

5. An apparatus, comprising:

a first processing system configured to to predistort each one of a plurality of signals based on a respective one of a plurality of sets of coefficients to generate a respective one of a plurality of predistorted signals;

a transceiver configured to output each one of the plurality of predistorted signals for transmission to a receiving device; and a second processing system communicatively couplable to the first processing system and configured to:

receive a plurality of feedback signals from the receiving device, wherein each one of the plurality of feedback signals provides feedback of a respective one of a plurality of receive signals at the receiving device corresponding to the transmission of a respective one of the plurality of predistorted signals;

determine an adjustment for at least one of the plurality of sets of coefficients based on at least one of the plurality of feedback signals; and select an adjusted set of coefficients to be output to the first processing system for storage in a memory coupled to the first processing system based on the determined adjustment.

6. The apparatus of claim 5, wherein the second processing system is further configured to select the adjusted set of coefficients by:

determining an amount of non-linear distortion for each one of the plurality of sets of coefficients based on the respective one of the plurality of feedback signals; and selecting the one of the plurality of sets of coefficients corresponding to a lowest determined amount of non-linear distortion as the adjusted set of coefficients.

7. The apparatus of claim 5, wherein:

the first processing system is further configured to:

retrieve the adjusted set of coefficients from the memory; and configure the predistorter to predistort a communication signal based on the retrieved selected adjusted set of coefficients to generate a predistorted communication signal; and the is further configured to output the predistorted communication signal for transmission.

8. The apparatus of claim 5, wherein the apparatus is configured as a wireless node, and the transceiver is configured to output each one of the plurality of predistorted signals for the transmission to the receiving device.

9. The wireless node of claim 8, wherein the transceiver comprises multiple transmit chains, and is configured to output each one of the plurality of predistorted signals to the multiple transmit chains for the transmission to the receiving device.

10. The wireless node of claim 9, wherein each of the multiple transmit chains includes a respective one of multiple power amplifiers.

11. A wireless node, comprising:

a first processing system including a predistorter configured to predistort a first signal based on a first set of coefficients to generate a first predistorted signal;

a transceiver configured to transmit the first predistorted signal for a first transmission to a receiving device; and a second processing system configured to receive a first feedback signal from the receiving device, wherein the first feedback signal provides feedback of a first receive signal at the receiving device corresponding to the first transmission;

wherein the second processing system is further configured to:

determine at least a second set of coefficients based on the received first feedback signal and whether the second set of coefficients should replace the first set of coefficients; and output the at least second set of coefficients to the first processing system based on the determination.

12. The wireless node of claim 11, wherein the transceiver comprises multiple transmit chains, and is configured to output the first predistorted signal to the multiple transmit chains for the first transmission to the receiving device.

13. The wireless node of claim 12, wherein each of the multiple transmit chains includes a respective one of multiple power amplifiers.

* * * * *